(12) United States Patent
Hanamachi et al.

(10) Patent No.: US 12,211,710 B2
(45) Date of Patent: Jan. 28, 2025

(54) STAGE, FILM-FORMING APPARATUS, AND FILM-PROCESSING APPARATUS

(71) Applicant: NHK SPRING CO., LTD., Yokohama (JP)

(72) Inventors: Toshihiko Hanamachi, Yokohama (JP); Arata Tatsumi, Yokohama (JP); Kenji Sekiya, Yokohama (JP); Naoya Aikawa, Yokohama (JP); Masaya Takanashi, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 305 days.

(21) Appl. No.: 17/219,316

(22) Filed: Mar. 31, 2021

(65) Prior Publication Data

US 2021/0217638 A1  Jul. 15, 2021

Related U.S. Application Data

(63) Continuation of application No. PCT/JP2019/038743, filed on Oct. 1, 2019.

(30) Foreign Application Priority Data

Oct. 11, 2018 (JP) .................................. 2018-192365
Jun. 17, 2019 (JP) .................................. 2019-111968

(51) Int. Cl.
*H01J 37/32* (2006.01)
*C23C 16/458* (2006.01)
(Continued)

(52) U.S. Cl.
CPC .... *H01L 21/67103* (2013.01); *C23C 16/4586* (2013.01); *C23C 16/46* (2013.01);
(Continued)

(58) Field of Classification Search
CPC ......... H01L 21/67103; H01L 21/67069; H01L 21/68757; H01J 37/32229;
(Continued)

(56) References Cited

U.S. PATENT DOCUMENTS 5,844,205 A * 12/1998 White ..................... C30B 25/12
219/390
6,035,101 A * 3/2000 Sajoto .................. C23C 16/4586
219/390
(Continued)

FOREIGN PATENT DOCUMENTS

CN  1662105 A  8/2005
CN  2825652 Y  10/2006
(Continued)

OTHER PUBLICATIONS

English translation of Written Opinion issued for corresponding International Patent Application No. PCT/JP2019/038743 on Dec. 17, 2019.
(Continued)

*Primary Examiner* — Charlee J. C. Bennett
(74) *Attorney, Agent, or Firm* — HAUPTMAN HAM, LLP

(57) ABSTRACT

Disclosed is a stage including a first supporting plate, a second supporting plate under the first supporting plate, a shaft under the second supporting plate and overlapping with the first supporting plate and the second supporting plate, and at least one sheath heater passing through the second supporting plate. The at least one sheath heater is arranged so as to extend on a first surface and a second surface which are parallel to an upper surface of the second supporting plate and which are different in distance from the first supporting plate from each other.

18 Claims, 21 Drawing Sheets

(51) Int. Cl.
*C23C 16/46* (2006.01)
*H01J 37/34* (2006.01)
*H01L 21/67* (2006.01)
*H01L 21/687* (2006.01)
*H05B 3/28* (2006.01)

(52) U.S. Cl.
CPC .. *H01J 37/32229* (2013.01); *H01J 37/32724* (2013.01); *H01J 37/32834* (2013.01); *H01J 37/3435* (2013.01); *H05B 3/28* (2013.01); *H01J 2237/3321* (2013.01); *H01J 2237/334* (2013.01); *H01L 21/67069* (2013.01); *H01L 21/68757* (2013.01); *H05B 2203/002* (2013.01); *H05B 2203/016* (2013.01)

(58) Field of Classification Search
CPC ........... H01J 37/32724; H01J 37/32834; H01J 37/3435; H01J 2237/3321; H01J 2237/334; H01J 2237/332–3348; H05B 3/28
USPC .......... 118/723, 715–733; 156/345.1–345.55
See application file for complete search history.

(56) References Cited

U.S. PATENT DOCUMENTS

| | | | |
|---|---|---|---|
| 2001/0035403 A1* | 11/2001 | Wang | H01L 21/67103 219/468.1 |
| 2002/0063120 A1* | 5/2002 | Yamaguchi | H01L 21/67103 219/460.1 |
| 2005/0194374 A1 | 9/2005 | Gelatos et al. | |
| 2006/0000822 A1 | 1/2006 | Nakamura | |
| 2010/0055351 A1* | 3/2010 | Kato | C23C 16/45521 118/712 |
| 2010/0224620 A1* | 9/2010 | Shibata | H01L 21/67103 219/460.1 |
| 2010/0287768 A1 | 11/2010 | Fujii et al. | |
| 2010/0314380 A1 | 12/2010 | Go et al. | |
| 2012/0211933 A1 | 8/2012 | Goto | |
| 2013/0313246 A1* | 11/2013 | Long | H05B 3/52 219/544 |
| 2013/0334199 A1 | 12/2013 | Yousif et al. | |
| 2017/0004995 A1 | 1/2017 | Asakawa et al. | |
| 2017/0167790 A1* | 6/2017 | Gaff | H05B 3/0014 |
| 2017/0280509 A1* | 9/2017 | Takebayashi | H05B 3/286 |
| 2018/0076067 A1* | 3/2018 | Kitabayashi | H01L 21/68785 |
| 2018/0226285 A1* | 8/2018 | Hanamachi | H01L 21/67017 |
| 2019/0355556 A1 | 11/2019 | Takahashi | |
| 2019/0385827 A1* | 12/2019 | Takahara | C23C 16/4583 |
| 2020/0043638 A1* | 2/2020 | Hanamachi | H01C 3/12 |
| 2020/0045779 A1* | 2/2020 | Hanamachi | H05B 3/10 |
| 2022/0151031 A1* | 5/2022 | Kida | H05B 3/06 |

FOREIGN PATENT DOCUMENTS

| | | |
|---|---|---|
| CN | 107408504 A | 11/2017 |
| EP | 1089593 A2 | 4/2001 |
| JP | S54-126146 U | 9/1979 |
| JP | H4-51789 U | 4/1992 |
| JP | H06-89776 A | 3/1994 |
| JP | H09-139280 A | 5/1997 |
| JP | 2001-102157 A | 4/2001 |
| JP | 2002-373933 A | 12/2002 |
| JP | 2003-92238 A | 3/2003 |
| JP | 2004-247210 A | 9/2004 |
| JP | 2008-243990 A | 10/2008 |
| JP | 2009-91660 A | 4/2009 |
| JP | 2014-509782 A | 4/2014 |
| JP | 2017-103325 A | 6/2017 |
| JP | 2017-174713 A | 9/2017 |
| KR | 10-2010-0133208 A | 12/2010 |
| TW | 201834001 A | 9/2018 |
| WO | 2018/159189 A1 | 9/2018 |
| WO | 2018/163935 A1 | 9/2018 |

OTHER PUBLICATIONS

Office Action issued on Apr. 11, 2023 for corresponding Japanese Patent Application No. 2019-111968, along with an English machine translation (10 pages).
Office Action issued on Aug. 1, 2022, for corresponding Chinese patent application No. 201980058340.0, along with and English translation.
Office Action issued on Mar. 18, 2023 for corresponding Chinese Patent Application No. 201980058340.0, along with an English machine translation (15 pages).
International Search Report issued for corresponding International Patent Application No. PCT/JP2019/038743 on Dec. 17, 2019, along with an English translation.
Written Opinion issued for corresponding International Patent Application No. PCT/JP2019/038743 on Dec. 17, 2019.
Office Action issued for corresponding Taiwanese Patent Application No. 108136073 on Nov. 26, 2020, along with an English translation.
Extended European Search Report dated Jun. 3, 2022 in connection with the counterpart European Patent Application No. EP19870485.0.
Office Action issued on Dec. 20, 2022, for corresponding Korean Patent Application No. 10-2021-7010871, along with an English machine translation (7 pages).
Office Action issued on Jun. 8, 2023, for corresponding Korean Patent Application No. 10-2021-7010871, along with an English translation (5 pages).
Office Action issued on Sep. 26, 2023, for corresponding Japanese Patent Application No. 2019-111968, along with an English machine translation (6 pages).
Office Action issued on Oct. 13, 2023 for corresponding Korean Patent Application No. 10-2023-7030822, along with an English translation (6 pages).
Office Action issued on Aug. 6, 2024 for corresponding Japanese Patent Application No. 2019-111968, along with an English machine translation (22 pages).
Patent Trial and Appeal Board Decisions issued on Mar. 28, 2024, for corresponding Korean Patent Application No. 10-2021-7010871, along with an English translation (24 pages).
Office Action issued on Oct. 24, 2024 for corresponding Korean Patent Application No. 10-2023-7030822, along with an English translation (5 pages).

\* cited by examiner

Prior Art

500

STAGE, FILM-FORMING APPARATUS, AND FILM-PROCESSING APPARATUS

CROSS REFERENCE TO RELATED APPLICATIONS

This application is based upon and claims the benefit of priority from the prior Japanese Patent Application No. 2018-192365 filed on Oct. 11, 2018, the prior Japanese Patent Application No. 2019-111968 filed on Jun. 17, 2019, and the PCT Application No. PCT/JP2019/038743 filed on Oct. 1, 2019, the entire contents of which are incorporated herein by reference.

FIELD

An embodiment of the present invention relates to a stage for supporting a substrate and a film-forming apparatus and a film-processing apparatus including the stage.

BACKGROUND

A semiconductor device is installed in almost all electronic devices and has an important role for their functions. A semiconductor device utilizes semiconductor properties of silicon or the like and is prepared by stacking a variety of patterned semiconductor films, insulating films, and conducting films over a substrate. These films are formed by utilizing an evaporation method, a sputtering method, a chemical vapor deposition (CVD) method, or a chemical reaction of the substrate and are patterned with a photolithography process. A photolithography process includes formation of a resist film over a film to be patterned, formation of a resist mask by light exposure and development of the resist film, partial removal of the film with etching, and removal of the resist mask.

The properties of these films are strongly influenced by the conditions when the films are formed or patterned. One of the conditions is the temperature of a substrate. In most cases, the temperature of the substrate is controlled by adjusting the temperature of a supporting stage (hereinafter, referred to as a stage) for placing a substrate. A sheath heater is frequently used as a heater for heating the stage in order to uniformly heat the substrate and suppress temperature variation in the substrate. For example, Japanese Patent Application No. 2009-91660 discloses a stage equipped with a plurality of sheath heaters in which an electrically heating wire (heater wire) is arranged in a metal sheath.

SUMMARY OF INVENTION

An object of an embodiment of the present invention is to provide a stage for precisely controlling the temperature of a substrate. Alternatively, an object of an embodiment of the present invention is to provide a film-forming apparatus or a film-processing apparatus including the stage.

An embodiment of the present invention is a stage. The stage includes a first supporting plate, a second supporting plate under the first supporting plate, a shaft located under the second supporting plate and overlapping with the first supporting plate and the second supporting plate, and at least one sheath heater passing through the second supporting plate. The at least one sheath heater is arranged so as to extend on a first plane and a second plane which are parallel to an upper surface of the second supporting plate and which are different in distance from the first supporting plate.

DESCRIPTION OF EMBODIMENTS

Figure 1A:
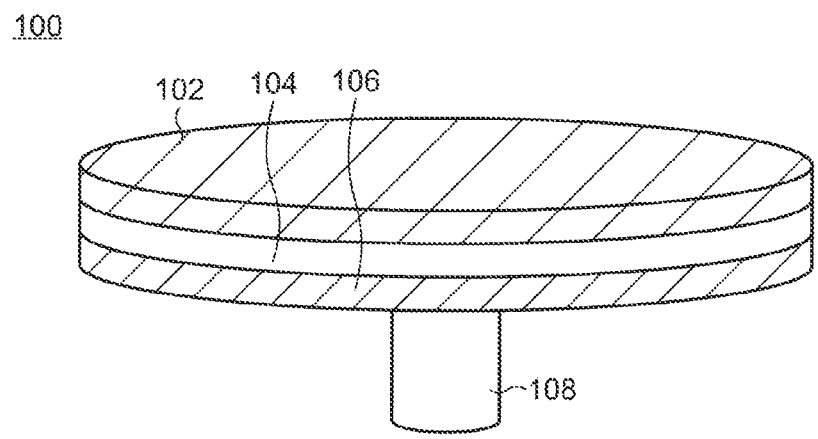
FIG. 1A and FIG. 1B are respectively schematic perspective and top views of a stage according to an embodiment of the present invention.

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the specification and drawings, the same reference numeral is used when the same or similar structures are collectively expressed, while a small letter is further added thereto when these structures are distinctively expressed. When a plurality of portions in a single structure is distinctively expressed, the same reference number is used and a hyphen and a natural number are further added.

First Embodiment

In the present embodiment, a stage 100 according to an embodiment of the present invention is explained.

1. Outline Structure

Figure 1B:
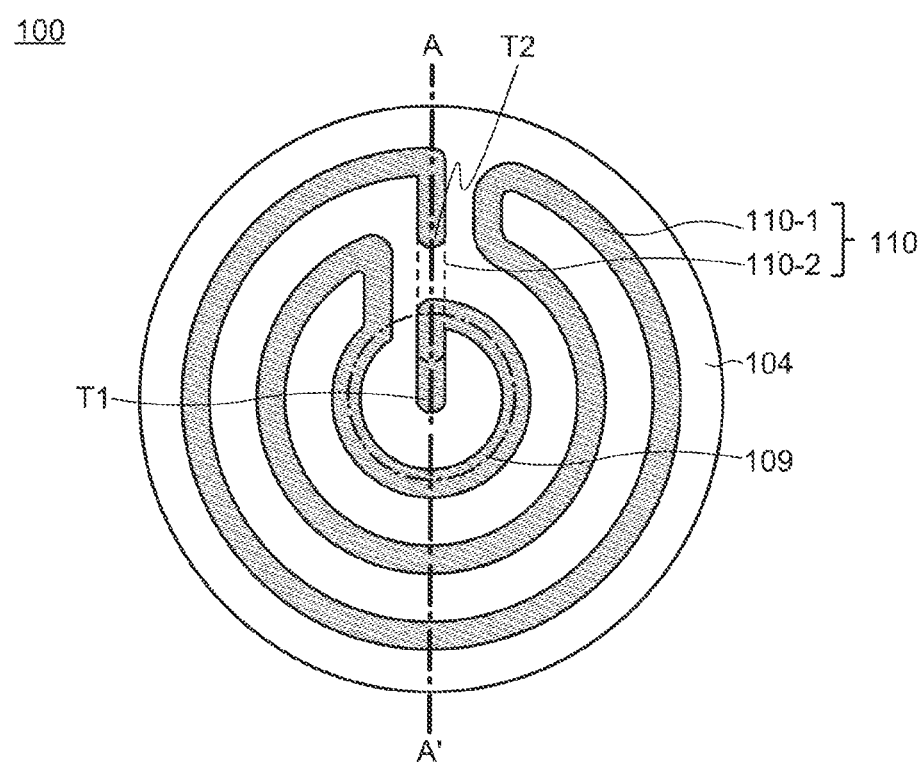
Figure 2A:
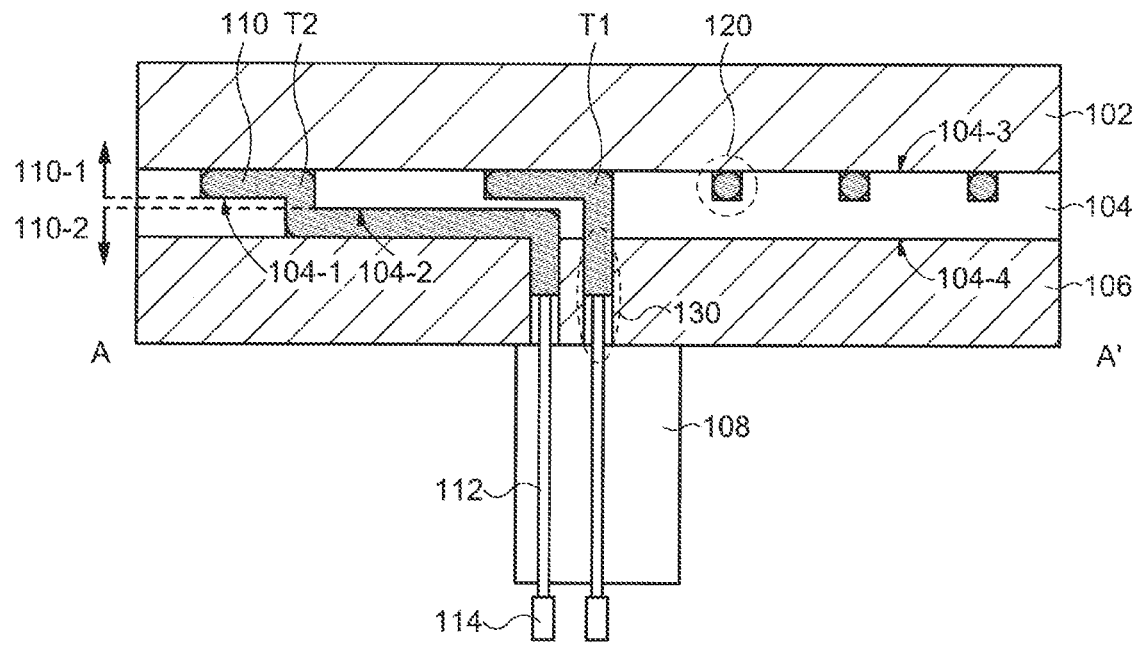
FIG. 2A and FIG. 2B are schematic cross-sectional views of a stage according to an embodiment of the present invention.
Figure 2B:
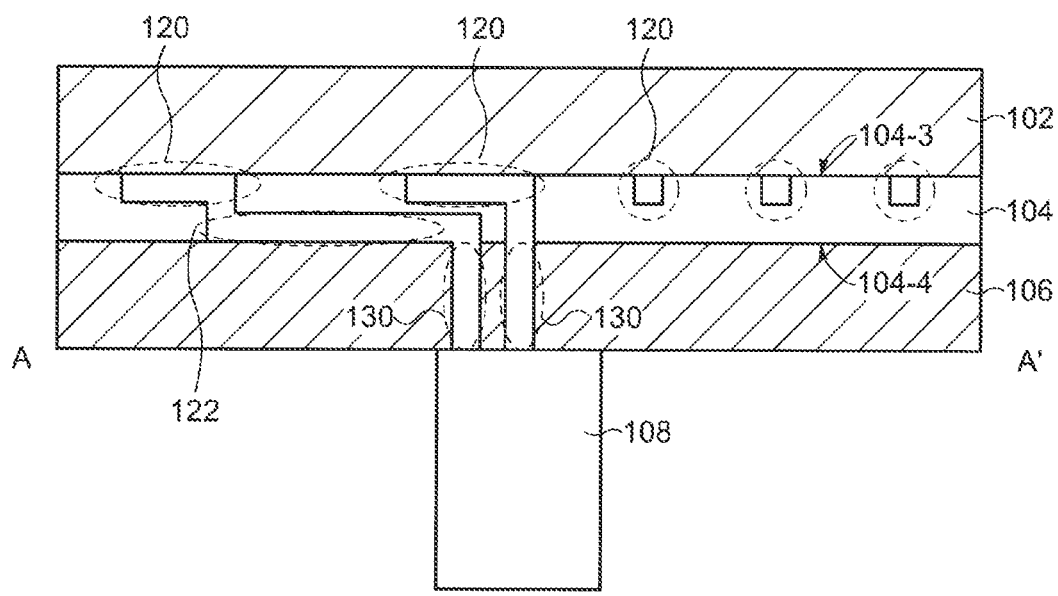

Schematic perspective and top views of the stage 100 are respectively illustrated in FIG. 1A and FIG. 1B. Schematic cross-sectional views along a chain line A-A' in FIG. 1B are shown in FIG. 2A and FIG. 2B. As shown in these drawings, the stage 100 includes a first supporting plate 102, a second supporting plate 104, a shaft 108, and at least one sheath heater 110 as a fundamental structure. The stage 100 may further include a third supporting plate 106. In these drawings, an example is shown in which a single sheath heater 110 is disposed. The first supporting plate 102 and the sheath heater 110 are not illustrated in FIG. 1A and FIG. 1B, respectively, for visibility.

2. First Supporting Plate

The first supporting plate 102 is configured to have a flat upper surface in order to arrange a semiconductor substrate including silicon or a compound semiconductor or an insulating substrate including an insulator such as quartz and glass thereon. The first supporting plate includes a metal selected from metals having a thermal conductivity equal to or higher than 10 W/mK and equal to or lower than 430 W/mK. The thermal energy generated by the sheath heater 110 can be efficiently received when a metal having a high thermal conductivity is employed. It is preferred that the metal have a thermal expansion coefficient equal to or more than $3 \times 10^{-6}$/K or equal to or less than $25 \times 10^{-6}$/K. Titanium, aluminum, stainless steel, and the like are represented as a metal satisfying these properties. Although not illustrated, an electrostatic chuck for fixing a substrate, a through hole for supplying a gas with a high thermal conductivity such as helium between a substrate and the stage 100, or a circulating path for circulating a fluid medium may be provided over the first supporting plate 102.

3. Second Supporting Plate

The second supporting plate 104 is disposed under the first supporting plate 102. The second supporting plate 104 also includes a metal usable for the first supporting plate 102. The metal included in the second supporting plate 104 may be the same as or different from the metal included in the first supporting plate 102. When they are different, the metals included in the first supporting plate 102 and the second supporting plate 104 may be selected so that a difference in thermal expansion coefficient therebetween is equal to or less than $250 \times 10^{-6}$/K, by which deformation induced by thermal expansion can be suppressed and the stage 100 with high reliability can be provided.

An upper surface 104-3 of the second supporting plate 104 is bonded to the first supporting plate 102. The bonding of the first supporting plate 102 and the second supporting plate 104 can be performed by welding, screwing, or brazing. The braze used in brazing is represented by an alloy including silver, copper, and zinc, an alloy including copper and zinc, copper including a slight amount of phosphorous, aluminum or an alloy thereof, an alloy including titanium, copper, and nickel, an alloy including titanium, zirconium, and copper, an alloy including titanium, zirconium, copper, and nickel, and the like.

4. Third Supporting Plate

The third supporting plate 106 as an optional structure is arranged under the second supporting plate 104. The third supporting plate 106 also includes a metal usable for the first supporting plate 102 and the second supporting plate 104. The metal included in the third supporting plate 106 may be the same as or different from the metal included in the first supporting plate 102 or the second supporting plate 104. When they are different, it is preferred to select a metal different in thermal expansion coefficient from those of the metals included in the first supporting plate 102 and the second supporting plate 104 by equal to or less than $10 \times 10^{-6}$/K.

The third supporting plate 106 is also bonded to a lower surface 104-4 of the second supporting plate 104. Similar to the bonding of the first supporting plate 102 to the second supporting plate 104, bonding of the third supporting plate 106 with the second supporting plate 104 may also be carried out by welding, screwing, or brazing.

5. Shaft

The shaft 108 is provided to support the first supporting plate 102, the second supporting plate 104, and the third supporting plate 106 and has a hollow structure to accommodate a lead wiring 112 supplying electrical power to a heater wire 118 of the sheath heater 110 described below. When an electrostatic chuck is disposed, a wiring for supplying electrical power to the electrostatic chuck is also arranged in the shaft 108. Although not illustrated, the shaft 108 may be connected to a rotating mechanism, by which the stage 100 can be rotated about a longitudinal axis of the shaft 108. The shaft 108 is bonded to the third supporting plate 106 by welding, screwing, or brazing. Note that the shaft 108 is bonded to the second supporting plate 104 when the third supporting plate 106 is not employed.

6. Sheath Heater

The sheath heater 110 has a function to generate heat when supplied with electricity and is disposed to heat the second supporting plate 104 and the first supporting plate 102, thereby allowing a substrate placed over the stage 100 to be heated. The detailed structure of the sheath heater 110 is described below. In the present embodiment, the arrangement of the sheath heater 110 in the stage 100 is explained in detail.

As shown in FIG. 2A, the sheath heater 110 passes through the second supporting plate 104. The sheath heater 110 is arranged so as to extend on two planes and to be parallel to these planes. That is, the sheath heater 110 is arranged so as to extend in parallel to the upper surface of the first supporting plate 102 or the upper surface 104-3 of the second supporting plate 104 and to extend on a first plane 104-1 and a second plane 104-2 different in distance from the first supporting plate 102. Compared with the second plane 104-2, the first plane 104-1 is closer to the first supporting plate 102. Hereinafter, the portions of the sheath heater 110 extending on the first plane 104-1 and the second plane 104-2 are respectively referred to as an upper section 110-1 and a lower section 110-2.

The upper section 110-1 is exposed from the upper surface 104-3 of the second supporting plate 104, while the lower section 110-2 is exposed from the lower surface 104-4 of the second supporting plate 104. Hence, when the stage 100 is viewed from above after removing the first supporting plate 102, only the upper section 110-1 of the sheath heater 110 is mainly observed, and the lower section 110-2 (a portion illustrated with a dotted line in FIG. 1B) is hardly observed as shown in FIG. 1B. At least a part of the second supporting plate 104 is sandwiched by the upper section 110-1 and the lower section 110-2. As shown in FIG. 2A, the upper section 110-1 and the lower section 110-2 may overlap with each other with the second supporting plate 104 sandwiched therebetween.

A trench (first trench) 120 is provided on the upper surface 104-3 of the second supporting plate 104 (FIG. 2B), and the upper section 110-1 is arranged in the first trench 120 (FIG. 2A). Thus, a bottom surface of the first trench 120 exists in the first plane 104-1. In the example shown in FIG. 2A and FIG. 2B, the first supporting plate 102 has the flat lower surface 104-4, and no trench is provided on the lower surface 104-4. Therefore, a depth of the first trench 120 is the same as or substantially the same as an external diameter of the sheath heater 110. Specifically, the depth of the first trench 120 is larger than 100% and equal to or smaller than 150%, larger than 100% and equal to or smaller than 120%, or larger than 100% and equal to or smaller than 110% of the external diameter of the sheath heater 110. The first trench 120 is formed on the upper surface 104-3 at a uniform density in order to decrease temperature variation in the plane of the first supporting plate 102.

A trench (second trench) 122 is similarly formed on the lower surface 104-4 of the second supporting plate 104 (FIG. 2B), and the lower section 110-2 is arranged in the second trench 122. Hence, a bottom surface of the second trench 122 exists in the second plane 104-2. In the example shown in FIG. 2A and FIG. 2B, the third supporting plate 106 has a flat upper surface, and no trench is formed on the upper surface. Therefore, a depth of the second trench 122 is the same as or substantially the same as the external diameter of the sheath heater 110 or the depth of the first trench 120.

Through holes passing through the second supporting plate 104 are formed at both terminals of the first trench 120. The sheath heater 110 is bent through the through holes. Hence, the upper section 110-1 is a portion between two bent portions of the sheath heater 110. Hereinafter, the terminals of the upper section 110-1 are referred to as T1 and T2, respectively (see FIG. 1B and FIG. 2A).

One terminal T1 is located in a region 109 (the region surrounded by a circle formed from a dotted line in FIG. 1B) where the first supporting plate 102 and the second supporting plate 104 overlap with the shaft 108. The sheath heater 110 folded at the terminal T1 passes through a through hole 130 formed in the third supporting plate (FIG. 2B), extends into the shaft 108, and is further connected, through the lead wiring 112 and terminal 114, to a heater power source which is not illustrated (FIG. 2A).

On the other hand, the other terminal T2 may be located outside the region 109 as shown in FIG. 1B and FIG. 2A. The sheath heater 110 bent at the terminal T2 is bent again and extends on the second plane 104-2 to the region 109. The sheath heater 110 is bent again on the second plane 104-2 in the region 109, passes through a through hole 130, extends in the shaft 108, and is connected, through the lead wiring 112 and the terminal 114, to the heater power source which is not illustrated (FIG. 2A).

Implementation of the aforementioned structure not only improves freedom of layout of the sheath heater 110 but also enables more uniform heating of a substrate, which is explained by comparing with a conventional stage.

Figure 3A:
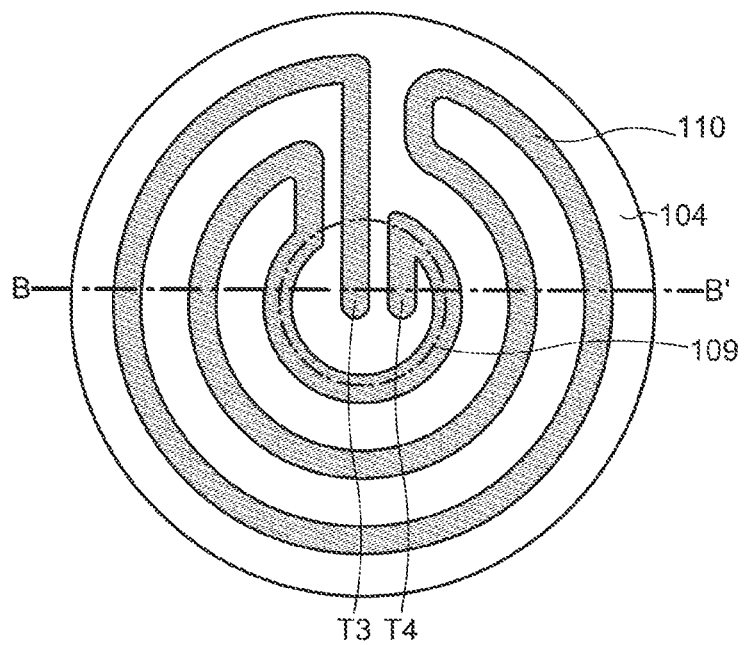
FIG. 3A and FIG. 3B are respectively schematic top and cross-sectional views of a conventional stage.
Figure 3B:
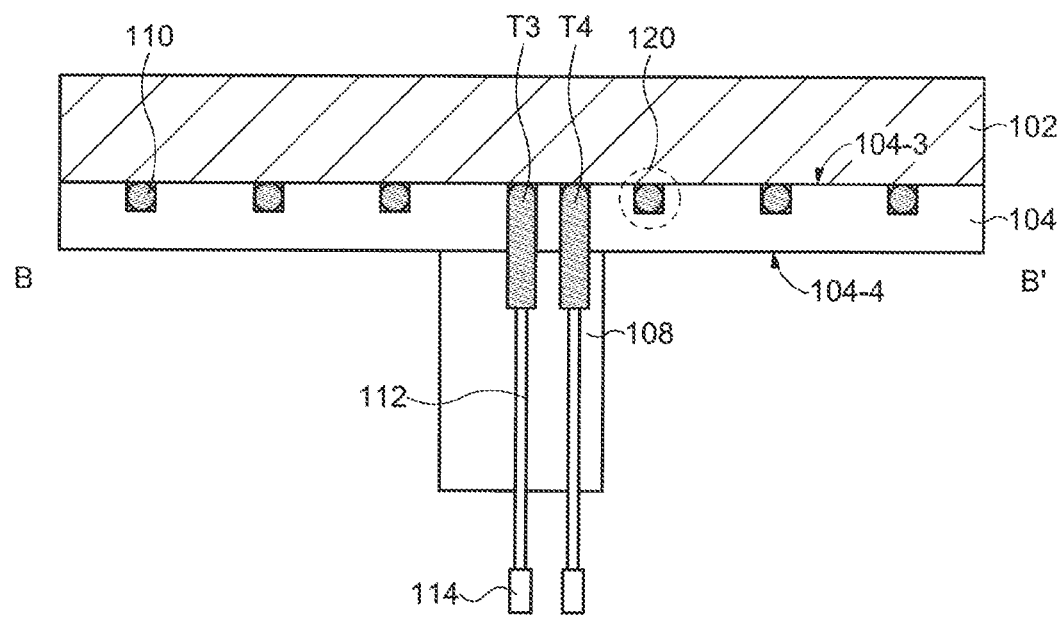

A schematic top view of a stage having a conventional structure is shown in FIG. 3A, and a schematic cross-sectional view along a chain line B-B' is shown in FIG. 3B. Unlike the stage 100, no trench is formed on the lower surface 104-4 of the second supporting plate 104, and the sheath heater 110 does not include the lower section 110-2 extending on the second plane 104-2 in the stage with the conventional structure. Therefore, it is necessary to arrange both terminals T3 and T4 of the portion of the sheath heater 110, which are exposed from the upper surface 104-3 of the second supporting plate 104, in the region 109 in order to supply electrical power to the sheath heater 110 through the shaft 108. In such an arrangement, it is difficult to arrange all of the terminals T3 and T4 of all the sheath heaters 110 in the region 109 when a large number of sheath heaters 110 is employed because the size of the shaft 108 is limited. As a result, the number of the sheath heaters 110 which can be arranged is limited. Hence, it is impossible to precisely control the temperature segment by segment by segmenting the upper surface of the stage. In addition, it is difficult to uniformly heat a substrate because all of the terminals T3 and T4 of all of the plurality of sheath heaters 110 are localized in the region 109, which results in a higher temperature of the region 109 than that of the outside thereof.

In contrast, in the stage 100, all of the sheath heaters 110 can be provided with electrical power by arranging only the terminal T1 of each upper section 110-1 in the region 109 even though a plurality of sheath heaters 110 are disposed. Alternatively, in the case of using the mono-terminal type sheath heater 110 having a pair of terminals at only one end as described below, it is not always necessary to arrange each sheath heater 110 so that both terminals of the upper section 110-1 are located in the region 109. Hence, a large number of sheath heaters 110 can be arranged in a variety of layouts, and overheating of the stage center can be prevented.

Second Embodiment

In the present embodiment, modified examples of the stage 100 described in the First Embodiment are explained with reference to FIG. 4A to FIG. 6B. These drawings are schematic cross-sectional views corresponding to FIG. 2A. An explanation of the structures the same as or similar to those of the First Embodiment may be omitted.

1. Modified Example 1

Figure 4A:
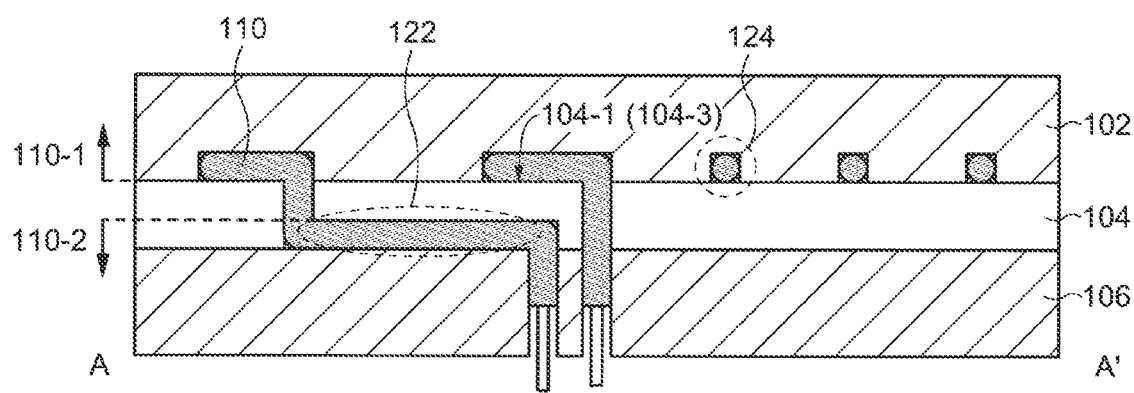
FIG. 4A and FIG. 4B are schematic cross-sectional views of a stage according to an embodiment of the present invention.

As shown in FIG. 4A, no trench (first trench 120) is formed on the upper surface 104-3 of the second supporting plate 104, but a trench (third trench 124) is formed on the lower surface of the first supporting plate 102 in the Modified Example 1. In this modified example, the upper section 110-1 is accommodated in the third trench 124. Hence, the first plane 104-1 exists in the upper surface 104-3 of the second supporting plate 104. The depth of the third trench 124 is the same as or substantially the same as the external diameter of the sheath heater 110. Specifically, the depth of the third trench 124 may be more than 100% and equal to or less than 150%, more than 100% and equal to or less than 120%, more than 100% and equal to or less than 110% of the external diameter of the sheath heater 110.

2. Modified Example 2

Figure 4B:
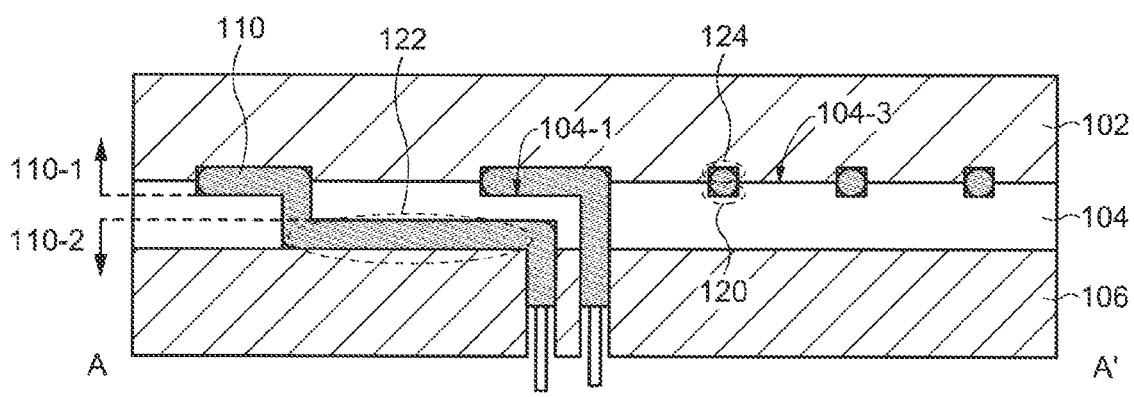

Alternatively, the first trench 120 as well as the third trench 124 may be respectively formed on the upper surface 104-3 of the second supporting plate 104 and the lower surface of the first supporting plate 102 as shown in FIG. 4B. In this modified example, the upper section 110-1 is accommodated in the first trench 120 and the third trench 124. Hence, a summation of the depths of the first trench 120 and the third trench 124 is the same as or substantially the same as the external diameter of the sheath heater 110. Specifically, the summation of the depths of the first trench 120 and the third trench 124 may be more than 100% and equal to or less than 150%, more than 100% and equal to or less than 120%, more than 100% and equal to or less than 110% of the external diameter of the sheath heater 110.

3. Modified Example 3

Figure 5A:
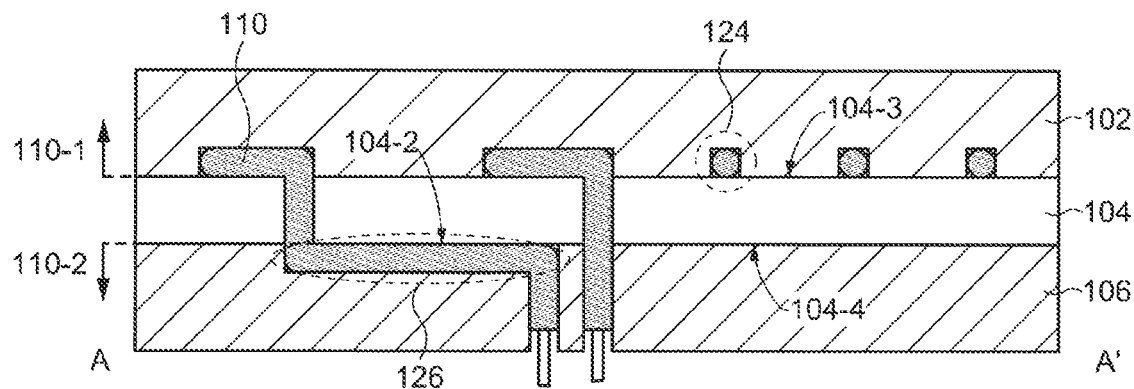
FIG. 5A to FIG. 5C are schematic cross-sectional views of a stage according to an embodiment of the present invention.

The Modified Example 3 shown in FIG. 5A is different from the Modified Example 1 (FIG. 4A) in that no trench (second trench 122) is formed on the lower surface 104-4 of the second supporting plate 104 but a trench (fourth trench 126) is formed on the upper surface of the third supporting plate 106. In this Modified Example 3, the lower section 110-2 is accommodated in the fourth trench 126. Hence, the second plane 104-2 exists in the lower surface 104-4 of the second supporting plate 104. The depth of the fourth trench 126 is the same as or substantially the same as the external diameter of the sheath heater 110. Specifically, the depth of the fourth trench 126 may be more than 100% and equal to or less than 150%, more than 100% and equal to or less than 120%, more than 100% and equal to or less than 110% of the external diameter of the sheath heater 110.

4. Modified Example 4

Figure 5B:
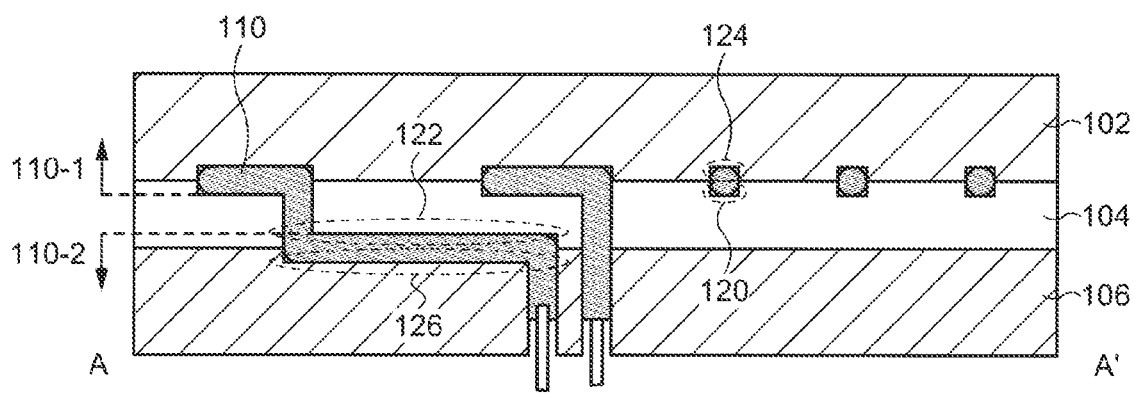

The Modified Example 4 shown in FIG. 5B is different from the Modified Example 2 (FIG. 4B) in that a trench (fourth trench) 126 is also formed on the upper surface of the third supporting plate 106. In this Modified Example, the lower section 110-2 is accommodated in the second trench 122 and the fourth trench 126. Hence, a summation of the depths of the second trench 122 and the fourth trench 126 is the same as or substantially the same as the external diameter of the sheath heater 110. Specifically, the summation of the depths of the second trench 122 and the fourth trench 126 may be more than 100% and equal to or less than 150%, more than 100% and equal to or less than 120%, more than 100% and equal to or less than 110% of the external diameter of the sheath heater 110.

5. Modified Example 5

Figure 5C:
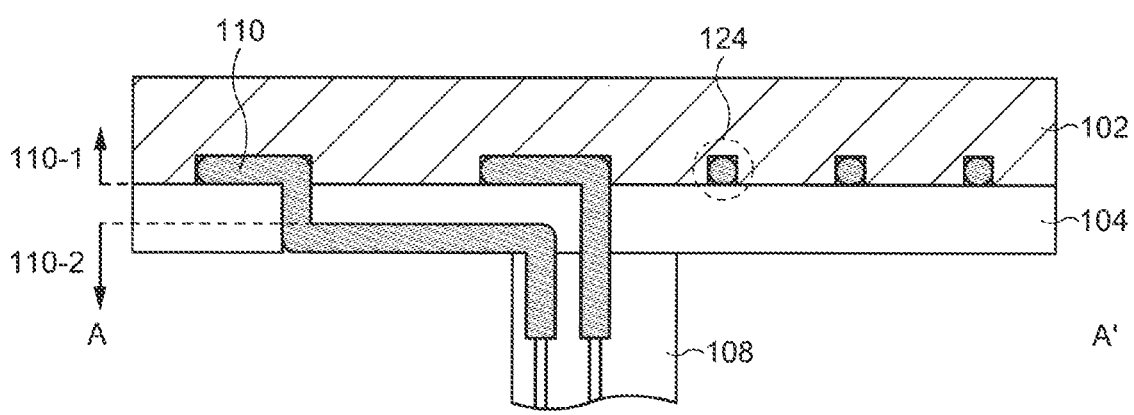

The Modified Example 5 shown in FIG. 5C is different from the Modified Example 1 (FIG. 4A) in that the third supporting plate 106 is not included. In this case, the lower section 110-2 also extends on the second plane 104-2 to the region 109.

6. Modified Example 6

Figure 6A:
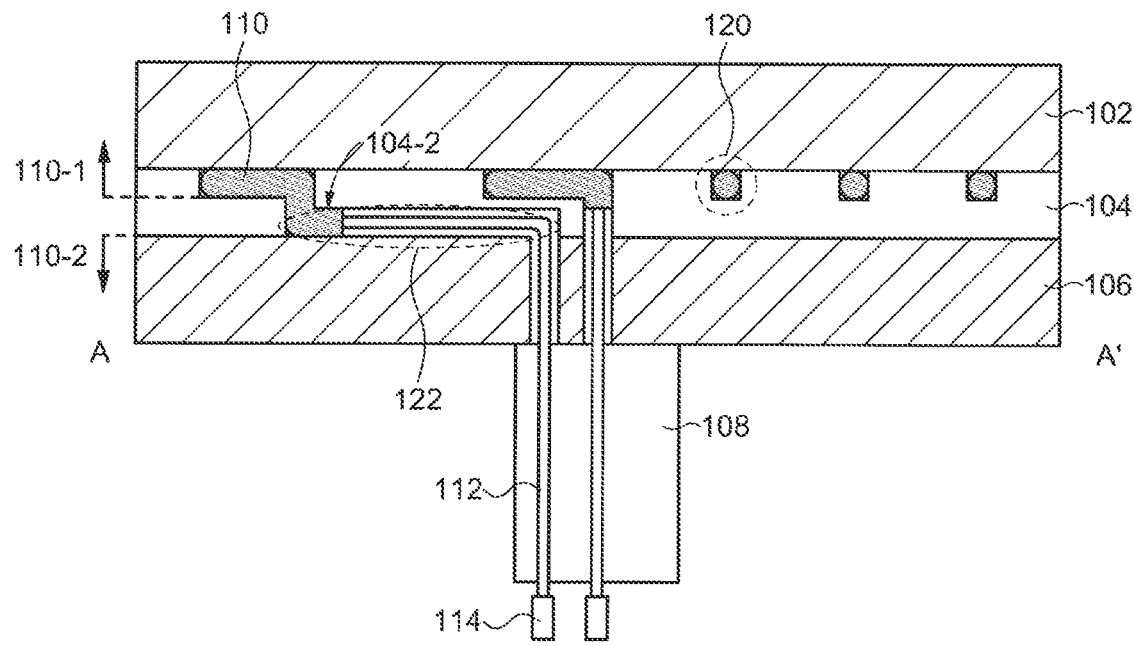
FIG. 6A and FIG. 6B are schematic cross-sectional views of a stage according to an embodiment of the present invention.
Figure 6B:
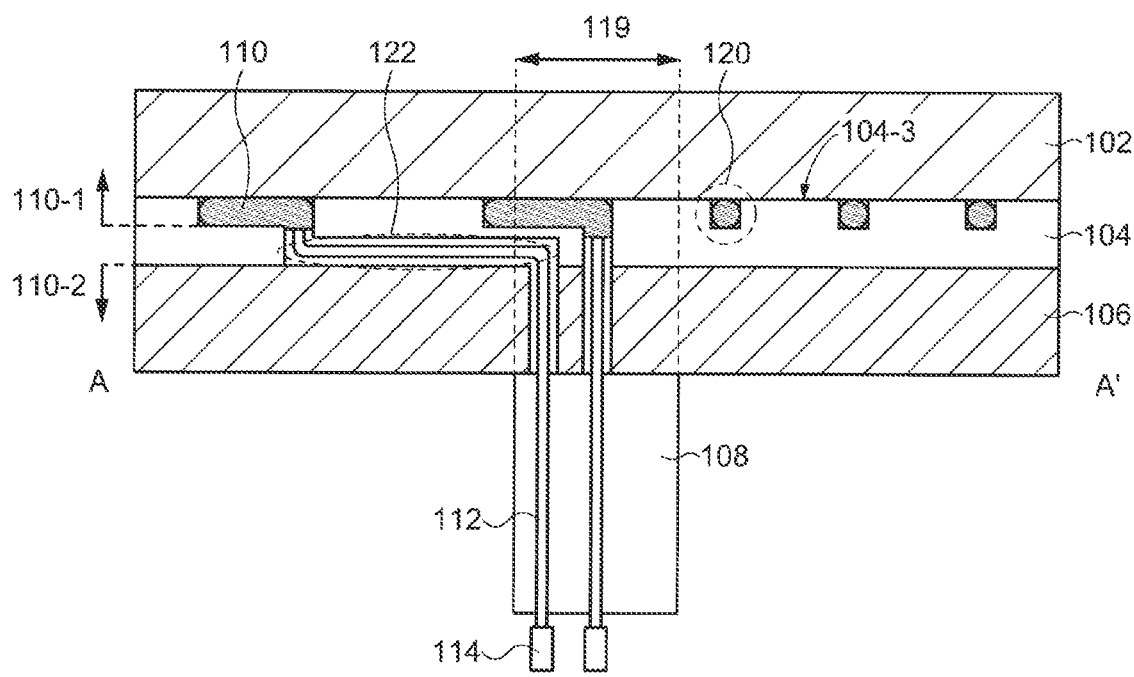

Alternatively, the lead wiring 112 (explained below) may be included in the lower section 110-2 as shown in FIG. 6A. In this case, the lead wiring 112 extends on the second plane 104-2 along the second trench 122. Alternatively, the lower section 110-2 may not include the heater wire 118 (explained below) but may be structured with only the lead wiring 112 or with only the lead wiring 112 and a connecting portion (not illustrated) for connecting the lead wiring 112 and the heater wire 118 as shown in FIG. 6B. The use of such a structure prevents a lower portion of the second supporting plate 104 from being heated but allows an upper portion thereof to be selectively heated. Moreover, local overheating of the center portion of the stage 100 can be more efficiently prevented because the lower section 110-2 does not include the heater wire 118 in the region 109.

Third Embodiment

In the present embodiment, stages 140 and 142 in which a plurality of independently operated sheath heaters 110 is arranged are explained. The following mode is an example of the present embodiment, and the number of sheath heaters 110 provided to the stages 140 and 142 is not limited. An explanation of the structures the same as or similar to those of the First and Second Embodiments may be omitted.

Figure 7A:
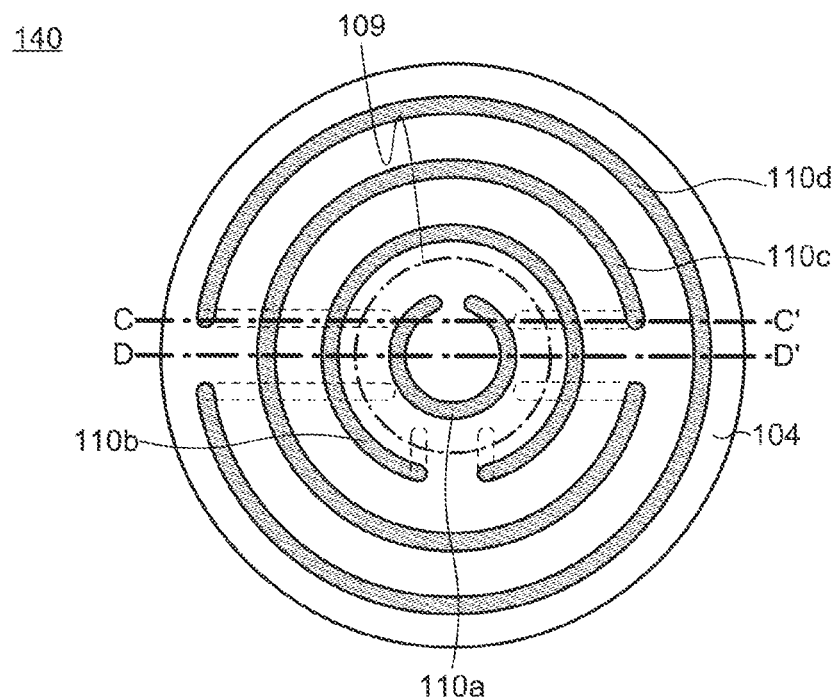
FIG. 7A and FIG. 7B are respectively schematic top and cross-sectional views of a stage according to an embodiment of the present invention.
Figure 7B:
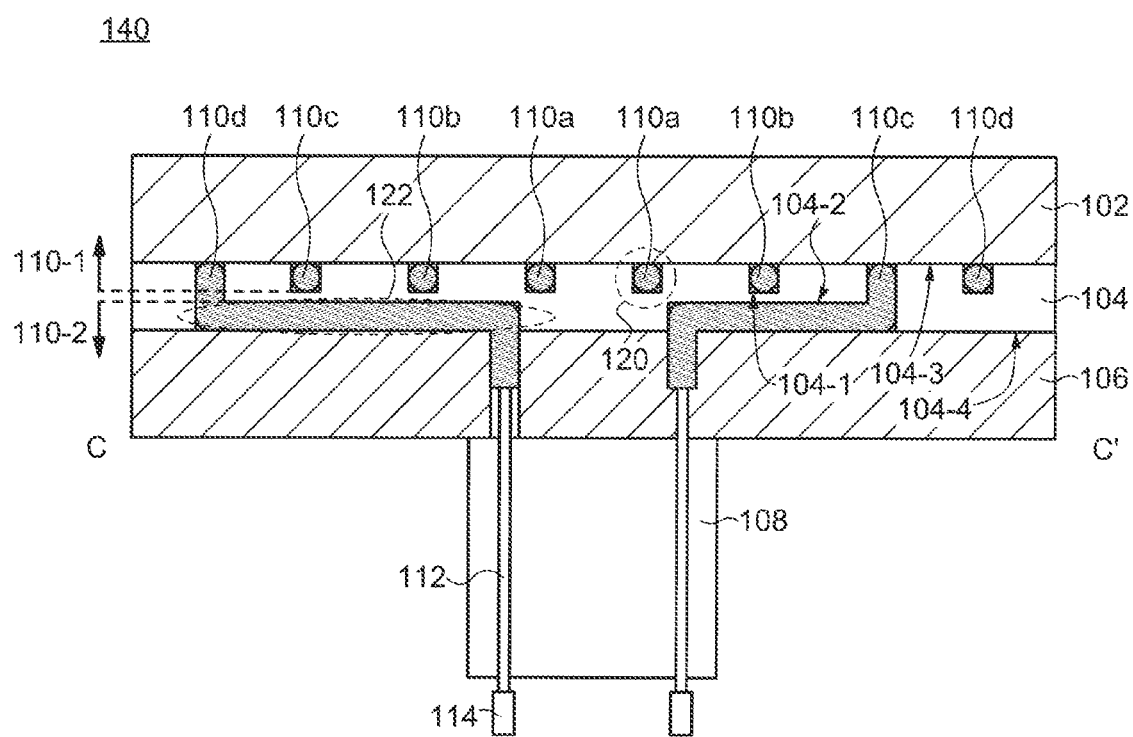

A schematic top view and a cross sectional view of the stage 140 are respectively shown in FIG. 7A and FIG. 7B. In FIG. 7A, the first supporting plate 102 is not illustrated. As shown in these drawings, four substantially concentrically arranged sheath heaters (a first sheath heater 110a, a second sheath heater 110b, a third sheath heater 110c, and a fourth sheath heater 110d) are provided to the stage 140. These sheath heaters 110 each form an arc on the first plane 104-1, and their radiuses increase in order from the first sheath heater 110a. In the example shown here, the whole of the first sheath heater 110a is located in the region 109, while the upper sections 110-1 of the other sheath heaters 110 are located outside the region 109. However, the upper sections 110-1 of the other sheath heaters 110 may be partly located in the region 109.

Here, at least one of the plurality of sheath heaters 110 has two lower sections 110-2 and one upper section 110-1 located therebetween. Specifically, the fourth heater 110d has the upper section 110-1 extending on the first plane 104-1 and two lower sections extending on the second plane 104-2 and separated from each other as shown in FIG. 7A and FIG. 7B. Two lower sections 110-2 extend on the second plane 104-2 to the region 109. The same is applied to the second sheath heater 110b and the third sheath heater 110c.

As can be understood from these drawings, the lower portion 110-2 of one sheath heater 110 selected from the plurality of sheath heaters 110 may overlap with or intersect with the upper sections 110-1 of the other sheath heaters 110. For instance, in the example shown in FIG. 7B, the lower sections 110-2 of the fourth sheath heater 110d overlap with and intersect with the upper sections 110-1 of the second sheath heater 110b and the third sheath heater 110c. Similarly, the lower sections 110-2 of the third sheath heater 110c overlap with and intersect with the upper section 110-1 of the second sheath heater 110b.

Figure 8A:
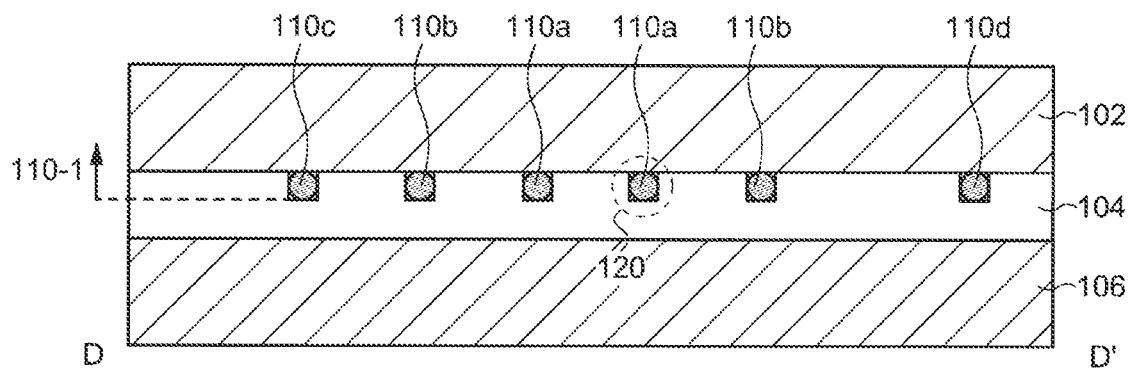
FIG. 8A to FIG. 8C are schematic cross-sectional views of a stage according to an embodiment of the present invention.
Figure 8B:
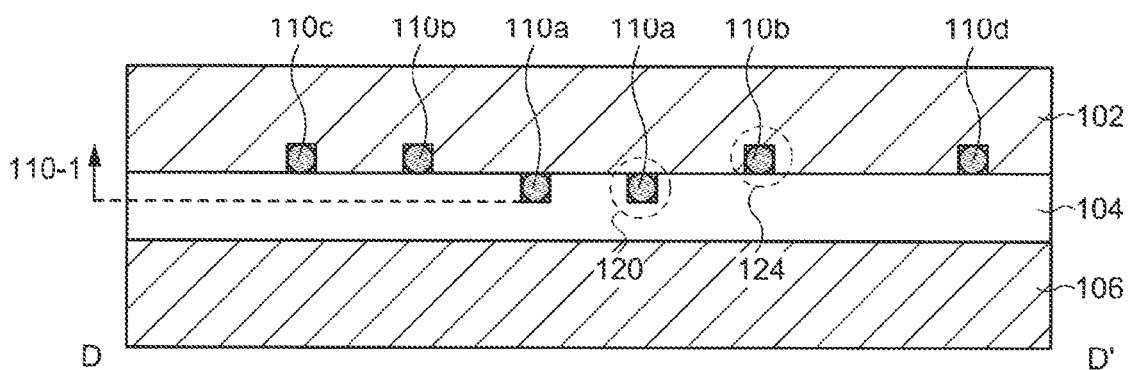
Figure 8C:
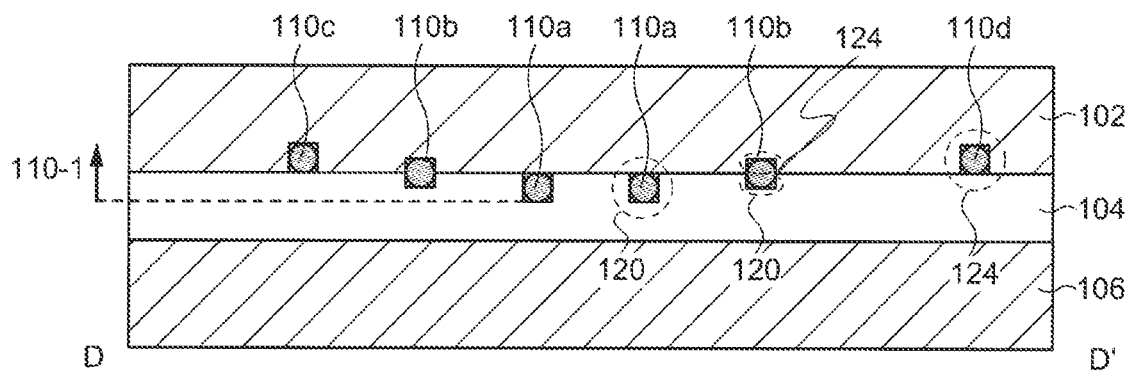

The upper sections 110-1 of the plurality of sheath heaters 110 may be arranged in different layers. Specifically, all of the upper sections 110-1 of the plurality of sheath heaters 110 may be arranged in the trenches (here, first trenches 120 formed in the second supporting plate 104) existing in the same layer as shown in FIG. 8A which is a schematic cross-sectional view along a chain line D-D' in FIG. 7A or may be arranged in different layers as shown in FIG. 8B and FIG. 8C. In the example of FIG. 8B, the upper section 110-1 of the first sheath heater 110a is arranged in the first trench 120, while the upper sections of the other sheath heaters 110 are disposed in the third trenches 124 formed in the first supporting plate 102. On the other hand, the upper section 110-1 of the second sheath heater 110b is disposed in the first trench 120 and the third trench 124 in the example shown in FIG. 8C.

Figure 9:
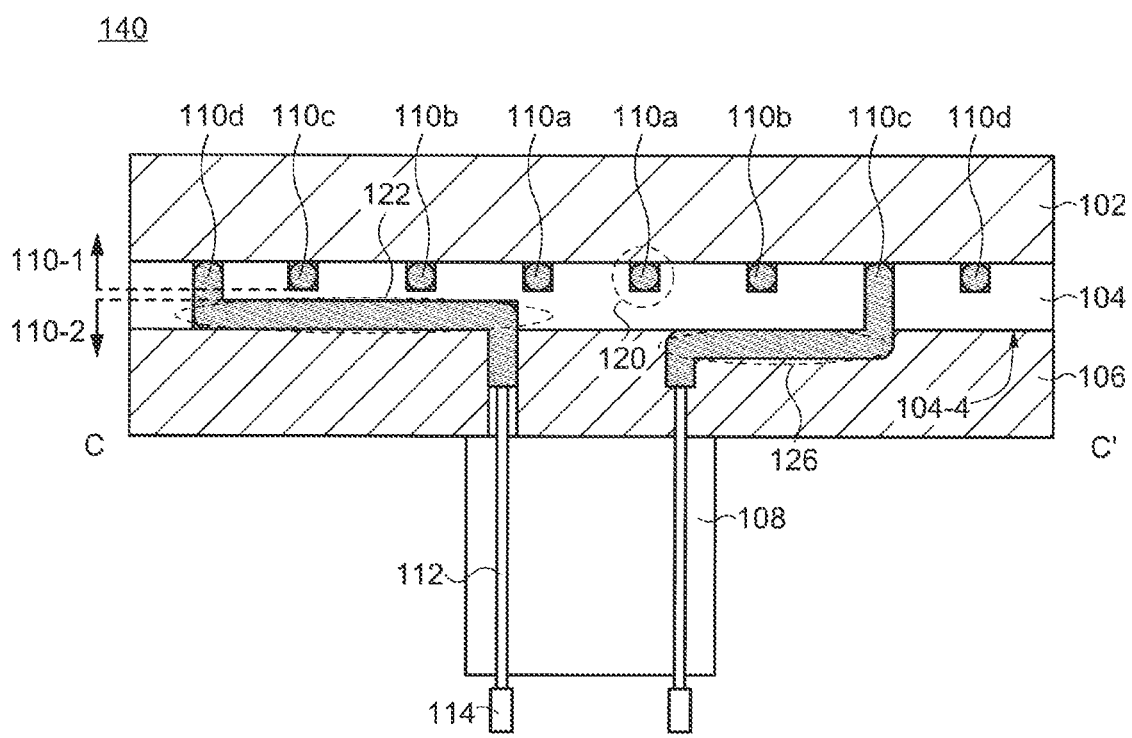
FIG. 9 is a schematic cross-sectional view of a stage according to an embodiment of the present invention.

Similarly, the lower sections 110-2 of the plurality of sheath heaters 110 may be arranged in different layers (trenches). For example, as shown in the schematic cross-sectional view of FIG. 9, the lower sections 110-2 of a part of the sheath heaters 110 (here, fourth sheath heater 110d) may be arranged in the second trenches 122 formed on the lower surface 104-4 of the second supporting plate 104, and the lower sections 110-2 of the other sheath heater 110 (here, the third sheath heater 110c) may be arranged in the fourth trenches 126 formed on the upper surface of the third supporting plate 106.

In the stage 140 exemplified in FIG. 7A, the sheath heater having both terminals of the upper section 110-1 in the region 109 is only the first sheath heater 110a among the plurality of sheath heaters 110, and both terminals of each of the upper sections 110-1 of the second sheath heaters 110b to the fourth sheath heaters 110d are located outside the region 109. Hence, it is possible to prevent both terminals of the upper sections 110-1 of the plurality of sheath heaters 110 from being localized at the center portion of the second supporting plate 104. In other words, it is not necessary to fold all of the sheath heaters 110 and place both ends of the sheath heaters 110 in the region 109 over the second supporting plate 104. Hence, the localized overheating at the center portion of the stage 140 can be prevented, and the limitation to the layout of the sheath heaters 110 is remarkably decreased. Accordingly, it is possible to establish a layout which enables uniform heating of a substrate. For example, the plurality of sheath heaters 110 can be arranged so that the upper sections have high symmetry in the second supporting plate.

Figure 10A:
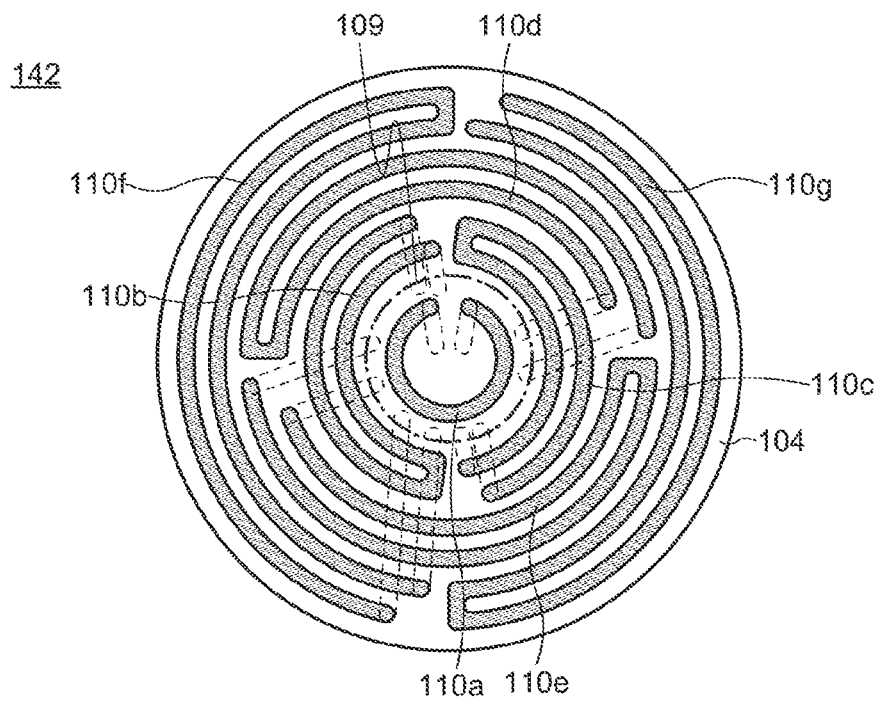
FIG. 10A and FIG. 10B are schematic top views of a stage according to an embodiment of the present invention.

For example, as demonstrated by the stage 142 shown in FIG. 10A, the plurality of sheath heaters 110 having arc-shaped upper sections 110-1 can be highly symmetrically arranged. More specifically, the stage 142 includes first sheath heater 110a to seventh sheath heater 110g. The first sheath heater 110a has a substantially circular arc-shaped upper section 110-1. On the other hand, the second sheath heater 110b to the seventh sheath heater 110g each have the upper section 110-1 having a shape in which terminals of two arcs with different radiuses are connected to each other.

The upper sections 110-1 of the second sheath heater 110b and the third sheath heater 110c may have the same shape and may be arranged to surround the first sheath heater 110a so that one of the second sheath heater 110b and the third sheath heater 110c overlaps with the other when rotated by 180° about an axis passing through a center of the second supporting plate 104. That is, if the upper sections 110-1 of the second sheath heater 110b and the third sheath heater 110c are recognized as an integrated single structure, this structure has a C2 rotation axis.

Similarly, the upper sections 110-1 of the fourth sheath heater 110d and the fifth sheath heater 110e may have the same shape and may be arranged to surround the first sheath heater 110a, the second sheath heater 110b, and the third sheath heater 110c so that one of the fourth sheath heater 110d and the fifth sheath heater 110e overlaps with the other when rotated by 180° about the axis passing through the center of the second supporting plate 104. That is, if the upper sections 110-1 of the fourth sheath heater 110d and the fifth sheath heater 110e are recognized as an integrated single structure, this structure has a C2 rotation axis. The same is applied to the upper sections 110-1 of the sixth sheath heater 110f and the seventh sheath heater 110g.

Figure 10B:
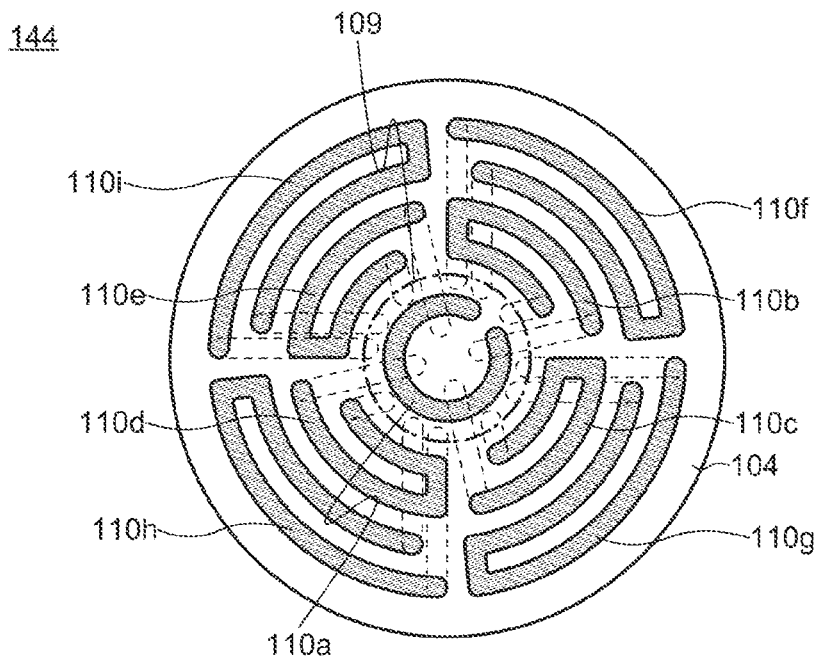

Alternatively, nine sheath heaters (first sheath heater 110a to ninth sheath heater 110i) can be highly symmetrically arranged as demonstrated by the stage 144 shown in FIG. 10B. In the example shown here, the second sheath heater 110b to ninth sheath heater 110i having the upper sections 110-1 with a shape in which terminals of two arcs with different radiuses are connected are arranged in addition to the first sheath heater 110a having the substantially circular arc-shaped upper section 110-1.

The upper sections 110-1 of the second sheath heater 110b to the fifth sheath heater 110e may have the same shape and may be arranged to surround the first sheath heater 110a so that one of the second sheath heater 110b to the fifth sheath heater 110e overlaps with the other one when rotated by 90° about the axis passing through the center of the second supporting plate 104. That is, if the upper sections 110-1 of the second sheath heater 110b to the fifth sheath heater 110e are recognized as an integrated single structure, this structure has a C4 rotation axis.

Similarly, the upper sections 110-1 of the sixth sheath heater 110f to the ninth sheath heater 110i may have the same shape and may be arranged to surround the first sheath heater 110a to the fifth sheath heater 110e so that one of the sixth sheath heater 110f to the ninth sheath heater 110i overlaps with the other one when rotated by 90° about the axis passing through the center of the second supporting plate 104. That is, if the upper sections 110-1 of the sixth sheath heater 110f to the ninth sheath heater 110i are recognized as an integrated single structure, this structure has a C4 rotation axis.

Moreover, a pair of sheath heaters having the upper sections 110-1 with different shapes is arranged in a single quarter circle in the stage 144. For example, the second sheath heater 110b and the sixth sheath heater 110f are arranged in a single quarter circle. Moreover, if the upper sections 110-1 of the second sheath heater 110b to the ninth sheath heater 110i are recognized as a single structure, this structure has a C4 rotation axis.

Although the aforementioned layouts are employed, only the first sheath heater 110a allows both terminals of the upper section 110-1 to be located in the region 109 among the plurality of sheath heaters 110, while both terminals of the upper sections 110-1 of the other sheath heaters 110 are located outside the region 109. Therefore, the localized overheating of the center portion of the stage 140 is prevented. In addition, the upper sections 110-1 of the plurality of sheath heaters 110 can be highly symmetrically arranged over the second supporting plate 104, which enables precise control of the temperature of a substrate.

Fourth Embodiment

In the present embodiment, the structure of the sheath heater 110 is explained.

1. Bi-Terminal Type Sheath Heater

Figure 11A:
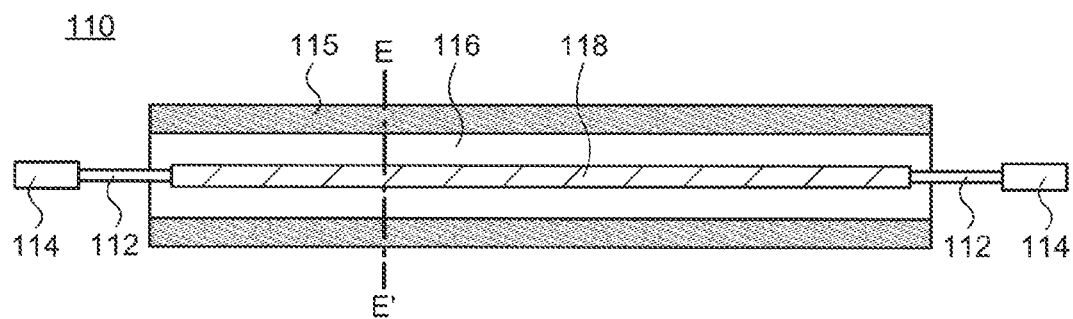
FIG. 11A to FIG. 11C are schematic cross-sectional views of a stage according to an embodiment of the present invention.
Figure 11B:
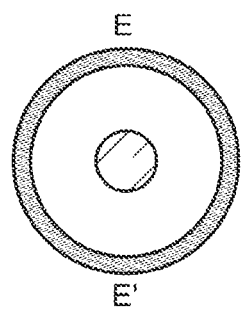
Figure 11C:
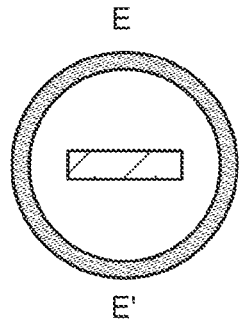

There is no limitation to the sheath heater 110 usable for the stage 100 according to the present embodiment, and the sheath heaters 110 with a variety of structures can be employed. Schematic cross-sectional views of the bi-terminal type sheath heater 110 are shown in FIG. 11A to FIG. 13C as an example. FIG. 11A is a schematic view of a cross section including a longitudinal axis of the sheath heater 110, whereas FIG. 11B and FIG. 11C are schematic cross-sectional views perpendicular to the longitudinal axis.

The sheath heater 110 illustrated in FIG. 11A includes the heater wire 118, an insulator 116 surrounding the heater wires 118, a metal sheath 115 surrounding the insulator 116, the pair of lead wirings 112 electrically connected to the heater wire 118, and the pair of terminals 114 electrically connected to the lead wirings 112. The metal sheath 115 and the heater wire 118 are electrically insulated by the insulator 116. As shown in FIG. 11A, a part of the lead wirings 112 may be surrounded by the insulator 116. Although not illustrated, a part of the heater wire 118 may be exposed from the insulator 116.

A conductor generating Joule heat when a current passes therethrough can be used for the heater wire 118. Specifically, a metal selected from tungsten, tantalum, molybdenum, platinum, nickel, chromium, and cobalt, an alloy including these metals, and the like can be used. An alloy of nickel and chromium, an alloy including nickel, chromium, and cobalt, and the like are represented as an alloy.

The insulator 116 is provided to prevent an electrical short circuit caused by contact of the heater wire 118 and the metal sheath 115. A material used for the insulator 116 may be selected from insulating materials having a thermal conductivity equal to or more than 10 W/mK and equal to or less than 300 W/mK. The use of such a material allows the thermal energy generated by the heater wire 118 to be efficiently transferred to the metal sheath 115. Magnesium oxide, aluminum oxide, boron nitride, aluminum nitride, and the like are exemplified as the insulator 116.

The metal sheath 115 includes a metal which can be selected from metals having a thermal conductivity equal to or more than 10 W/mK and equal to or less than 430 W/mK. The use of such a metal allows the thermal energy generated by the heater wire 118 to be efficiently transferred to the first supporting plate 102 and the second supporting plate 104. The metal is preferred to have a thermal expansion coefficient equal to or more than $3 \times 10^{-6}$/K and equal to or less than $25 \times 10^{-6}$/K. Furthermore, the metals used in the metal sheath 115, the first supporting plate 102, and the second supporting plate 104 may be the same as or different from one another. When they are different, the metal sheath 115, the first supporting plate 102, and the second supporting plate 104 are preferably configured so that differences in the thermal expansion coefficient between the metals included therein are equal to or less than $250 \times 10^{-6}$/K. With this structure, deformation caused by thermal expansion can be suppressed, and the stage with high reliability can be provided. Specifically, a metal or an alloy such as aluminum, titanium, and stainless steel can be used for the metal sheath 115.

The shape of the cross section of the sheath heater 110 perpendicular to the longitudinal axis is not limited: the shape may be a circular shape or rectangular shape as respectively shown in FIG. 11B and FIG. 11C or may be an ellipsoidal shape although not illustrated. In the case where the cross-sectional shape is a circular shape, the sheath heater 110 can be readily bent in an arbitral direction because the force required for deformation does not depend on the bending direction. Hence, the sheath heater 110 can be readily arranged in the trenches formed in the first supporting plate 102, the second supporting plate 104, and the like.

Figure 12A:
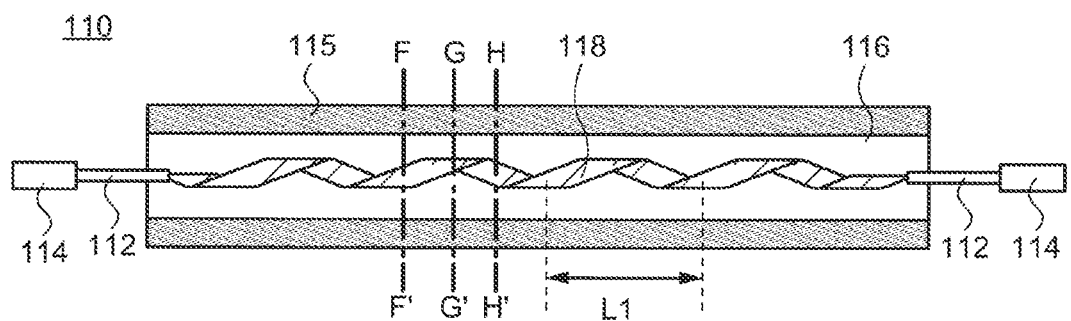
FIG. 12A to FIG. 12D are schematic cross-sectional views of a stage according to an embodiment of the present invention.
Figure 12B:
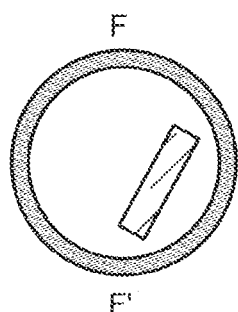
Figure 12C:
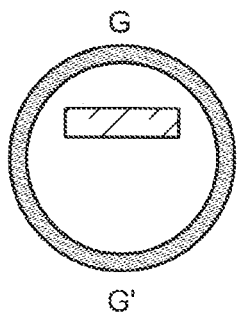
Figure 12D:
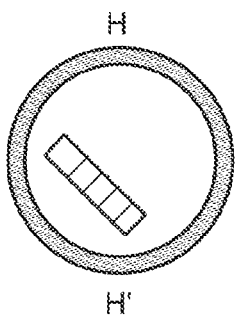

The shape of the cross section of the heater wire 118 perpendicular to the longitudinal axis of the sheath heater 110 is also not limited and may be circular (FIG. 11B) or polygonal (FIG. 11B). A rectangular cross-sectional shape provides the heater wire 118 with a ribbon shape. As shown in FIG. 12A, the heater wire 118 may be twisted to form a helical structure in the metal sheath 115. In this case, arrangement of the heater wire 118 in a plane perpendicular to the longitudinal direction continuously varies as demonstrated in the schematic cross-sectional views (FIG. 12B to FIG. 12D) including chain lines F-F', G-G', and H-H' perpendicular to the longitudinal axis. When the heater wire 118 with a ribbon shape has a helical structure, the helical structure is adjusted so that a pitch L of the helix is equal to or more than 1.0 mm and equal to or less than 3.0 mm, equal to or more than 1.0 mm and equal to or less than 2.5 mm, or equal to or more than 1.0 mm and equal to or less than 2.0 mm. Application of such a helical structure allows the length of the heater wire 118 per unit length of the metal sheath 115 to be increased, thereby increasing resistance of the sheath heater 110. Moreover, deformation of the heater wire 118 and breaking of the heater wire 118 caused by thermal expansion are suppressed because a spring property is provided to the heater wire 118. Hence, the sheath heater 110 with improved reliability can be supplied even if a difference in thermal expansion coefficient between the metal sheath 115 and the heater wire 118 is large.

Figure 13A:
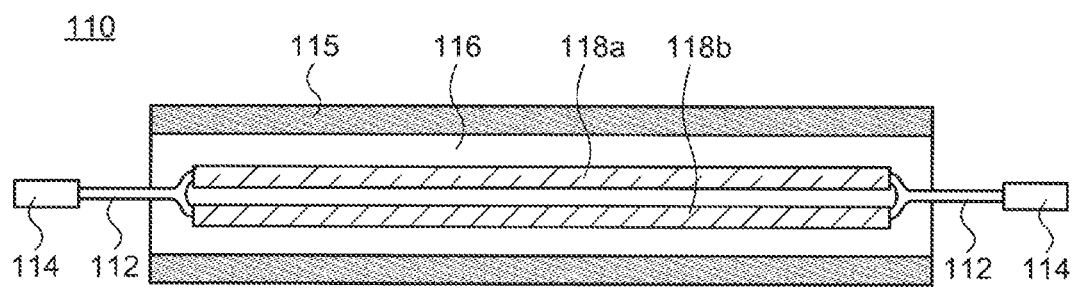
FIG. 13A to FIG. 13C are schematic cross-sectional views of a stage according to an embodiment of the present invention.
Figure 13B:
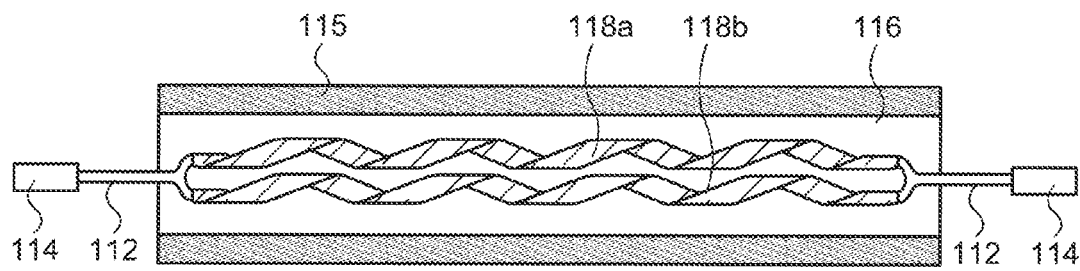
Figure 13C:
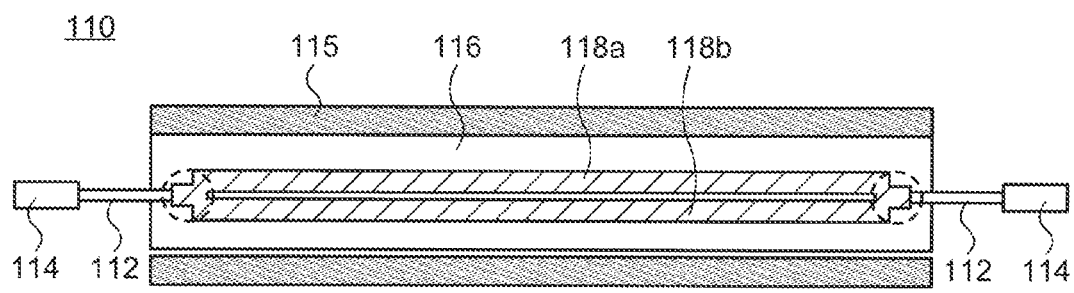

The sheath heater 110 may include a plurality of heater wires 118 in the metal sheath 115. For example, the sheath heater 110 may be configured so as to have the lead wirings 112 each having a branched structure where two heater wires 118a and 118b are connected to one lead wiring 112 and extend to the other lead wiring 112 as shown in FIG. 13A and FIG. 13B. In this case, the cross-sectional shape of each of the heater wires 118a and 118b may be arbitrarily set and may be selected from a circular shape, a rectangular shape, an ellipsoidal shape, and the like. When the cross-sectional shape is a rectangular shape, each heater wire 118 may form a helical structure as shown in FIG. 11B. Although not illustrated, the sheath heater 110 may have the plurality of heater wires 118 having different cross-sectional shapes. Moreover, the plurality of heater wires 118 may be formed so that the lead wirings do not have a branched structure but the heater wire 118 is branched in the metal sheath 115 as shown in FIG. 13C (see the structure in a dotted circle). The use of the plurality of heater wires 118 enables an increase in density of the heater wire 118 in the sheath heater 110, thereby more efficiently heating the second supporting plate 104 and the first supporting plate 102.

2. Mono-Terminal Type Sheath Heater

As shown in FIG. 4A, it is also possible to apply a mono-terminal type sheath heater 110. The mono-terminal type sheath heater 110 is different from the bi-terminal type sheath heater 110 in that the mono-terminal type sheath heater 110 has a cylinder shape having the metal sheath 115 with one closed end, the heater wire 118 is folded in the sheath heater 115, and both terminals of the heater wire 118 are taken from another terminal of the metal sheath 115. Hence, one heater wire 118 is arranged so as to have two axes (two cores) in the metal sheath 115 of the mono-terminal type sheath heater 110. In order to prevent an electrical short circuit of the heater wire 118 in the metal sheath 115, a segment from one terminal to the folded portion and a segment from the other terminal to the folded portion, namely, two segments of the heater wire 118 opposing each other are insulated by the insulator 116.

Figure 14A:
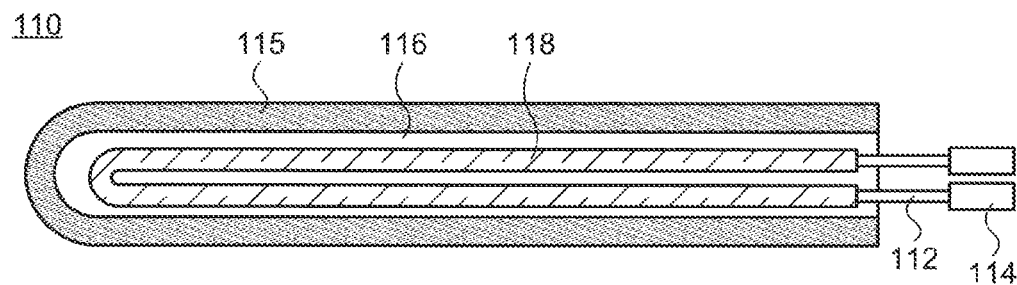
FIG. 14A to FIG. 14C are schematic cross-sectional views of a stage according to an embodiment of the present invention.
Figure 14B:
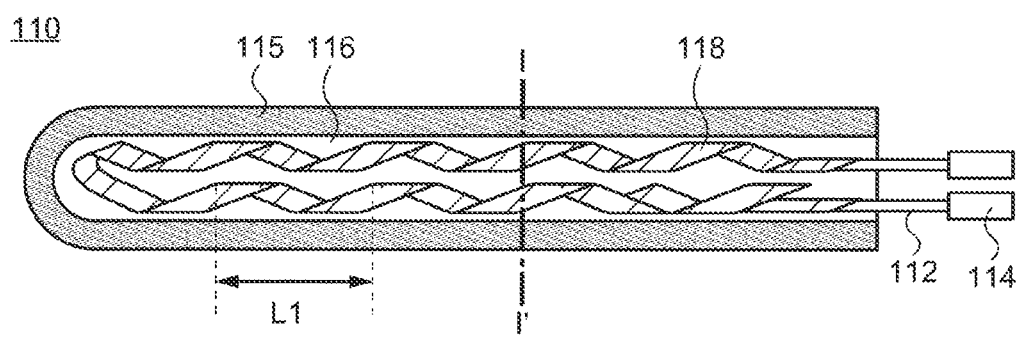

It is also possible to use the ribbon-shaped heater wire 118 for the mono-terminal type sheath heater 110, and the segment from the one terminal to the folded portion and the segment from the other terminal to the folded portion may independently have a helical structure (FIG. 14B). As shown in a schematic cross-sectional view including a chain line I-I' (FIG. 14C), the normal line of the heater wire 118 is substantially perpendicular to the direction in which the metal sheath 115 extends. In addition, the planes of the two segments of the heater wire 118 opposing each other are substantially parallel. Furthermore, it is possible to maintain the distance g2 between the two segments of the heater wire 118 opposing each other constant by adjusting the screw sense and the pitch L1 of the helical structures to be substantially the same. Accordingly, an electrical short circuit of the heater wire 118 can be prevented. Note that the screw senses and the pitches L1 of the two segments of the heater wire 118 opposing each other may be different from each other.

Figure 14C:
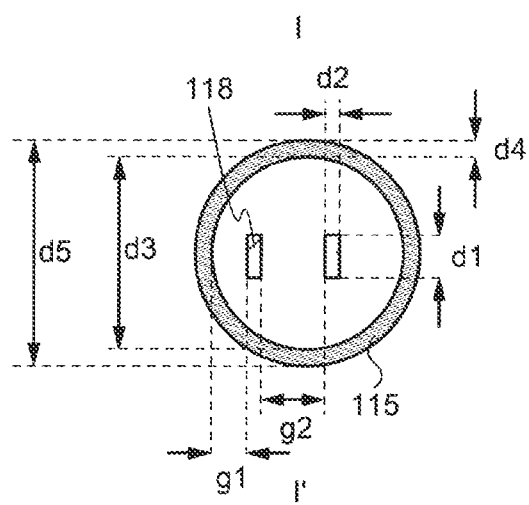

Referring to FIG. 14C, a width d1 of the heater wire 118 may be selected from a range equal to or more than 0.1 mm and equal to or less than 9.0 mm, and a thickness d2 may be selected from a range equal to or more than 0.1 mm and equal to or less than 3.0 mm. An internal diameter d3 of the metal sheath 115 may be selected from a range equal to or more than 3.0 mm and equal to or less than 9.0 mm, a thickness d4 of the metal sheath 115 may be selected from a range equal to or more than 0.5 mm and equal to or less than 2.0 mm, and an external diameter d5 of the metal sheath 115 may be selected from a range equal to or more than 3.0 mm and equal to or less than 11.0 mm. The shortest distance g1 between the heater wire 118 and the metal sheath 115 may be selected from a range equal to or more than 0.3 mm and equal to or less than 1.0 mm or equal to or more than 0.4 mm and equal to or less than 1.0 mm. The distance g2 between the segment from one terminal to the folded portion and the segment from the other terminal to the folded portion in the heater wire 118 may be selected from a range equal to or more than 0.3 mm and equal to or less than 2.0 mm or equal to or more than 0.4 mm and equal to or less than 1.0 mm. Employment of these parameters allows the formation of the fine sheath heater 110. As a result, the sheath heater 110 can be arranged in a minute layout, by which the temperature variation of a substrate can be further reduced. Moreover, it is also possible to secure the insulation between the metal sheath 115 and the heater wire 118 and prevent an electrical short circuit of the heater wire 118.

Figure 15A:
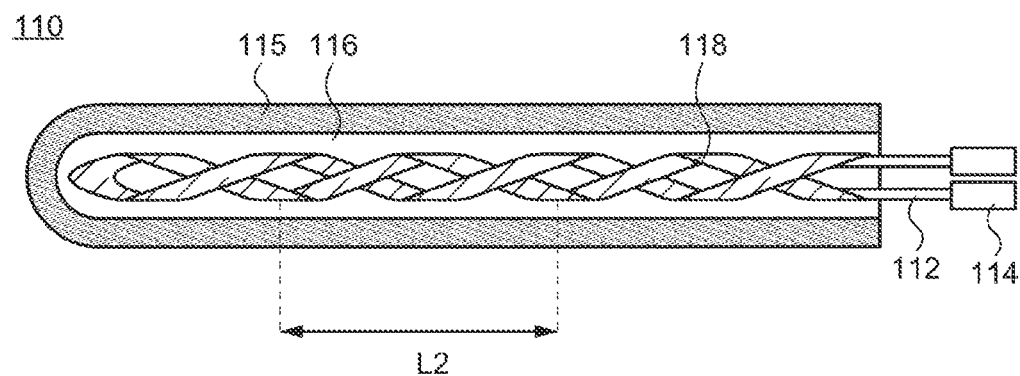
FIG. 15A and FIG. 15B are schematic cross-sectional views of a stage according to an embodiment of the present invention.

Alternatively, the heater wire 118 may be configured so that the two segments thereof opposing each other have a double-helical structure as shown in FIG. 15A. In this case, the heater wire 118 may be configured so that a pitch L2 of the helical structure of the heater wire 118 is equal to or more than 1.0 mm and equal to or less than 6.0 mm, equal to or more than 1.0 mm and equal to or less than 2.5 mm, or equal to or more than 1.0 mm and equal to or less than 2.0 mm.

Figure 15B:
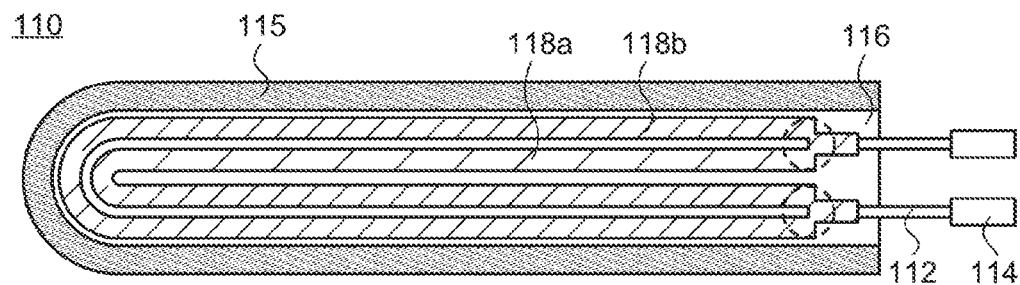

Similar to the bi-terminal type, the mono-terminal type sheath heater 110 may have the plurality of heater wires 118 in the metal sheath 115. For example, the sheath heater 110 may be configured so that the heater wire 118 has two branched structures (see the structure in a dotted circle) connected to the lead wirings 112 in the metal sheath 115 to have two heater wires 118a and 118b extending from one of the branched structures to the other as shown in FIG. 15B.

Figure 16A:
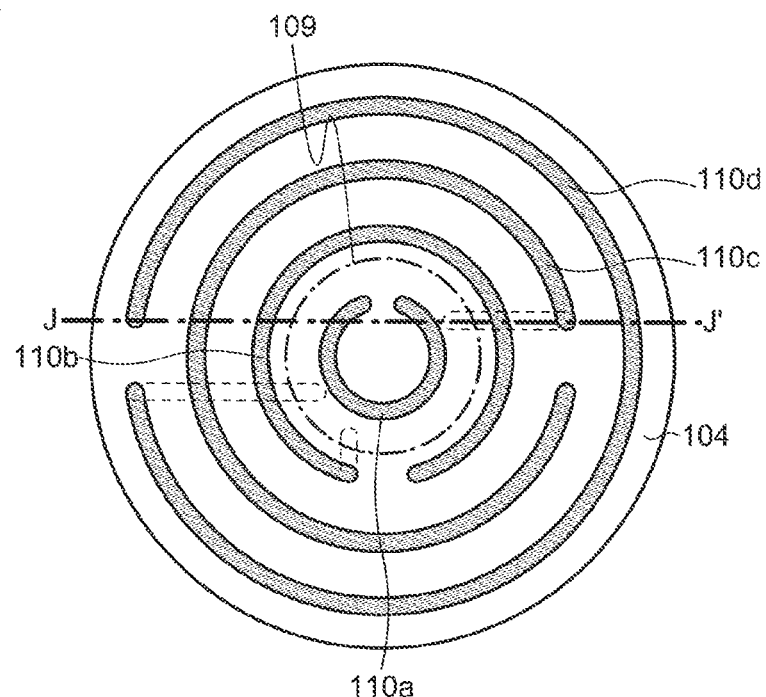
FIG. 16A and FIG. 16B are respectively schematic top and cross-sectional views of a stage according to an embodiment of the present invention.
Figure 16B:
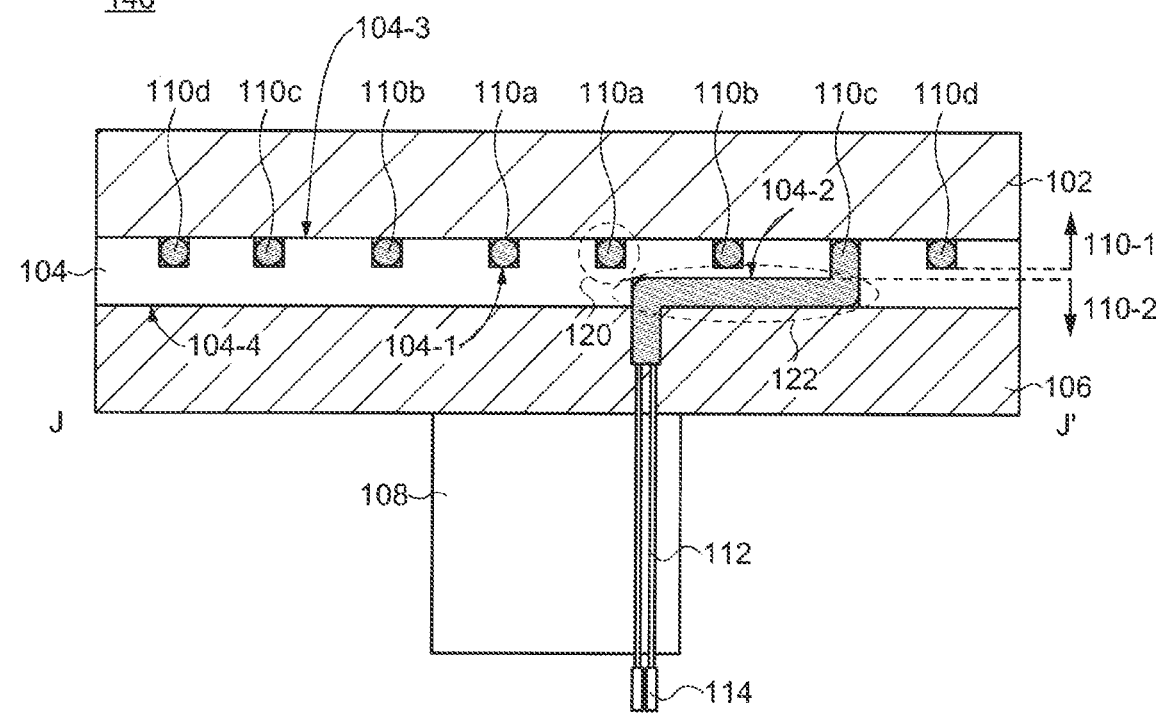

The degree of freedom in the layout of the sheath heater 110 can be further improved by using the mono-terminal type sheath heater 110. For example, the stage 146 shown in a schematic top view of FIG. 16A and a schematic view of a cross section along a chain line J-J' in FIG. 16A (FIG. 16B) is different from the stage 140 (see FIG. 7A and FIG. 7B) in that the mono-terminal sheath heater 110 is used instead of the bi-terminal type sheath heater 110. In the mono-terminal type sheath heater 110, one end (closed end) of the metal sheath 115 is closed, and the pair of lead wirings 112 is each connected to the other end (opened end) side of the metal sheath 115. Hence, only one through hole is prepared in the first trench 120 in which the upper section 110-1 is arranged, and the sheath heater 110 is folded so as to pass through this through hole. An end portion beyond this folded portion is the lower section 110-2 which extends to the region 109 on the second surface 104-2. Thus, each sheath heater 110 has a single lower section 110-2, and the number of the lower sections 110-2 extending to the region 109 is the same as or smaller than the number of the sheath heaters 110. Therefore, it is possible to reduce the number of the second trenches 122 extending to the region 109 and arrange more sheath heaters 110 in a high degree of freedom.

Fifth Embodiment

In the present embodiment, a film-forming apparatus and a film-processing apparatus each including the aforementioned stage 100, 140, 142, 144, or 146 are explained. In the present embodiment, a film-forming apparatus and a film-processing apparatus each equipped with the stage 100 are explained as an example. An explanation of the structures the same as or similar to those of the First to Fourth Embodiments may be omitted.

1. Etching Apparatus

Figure 17:
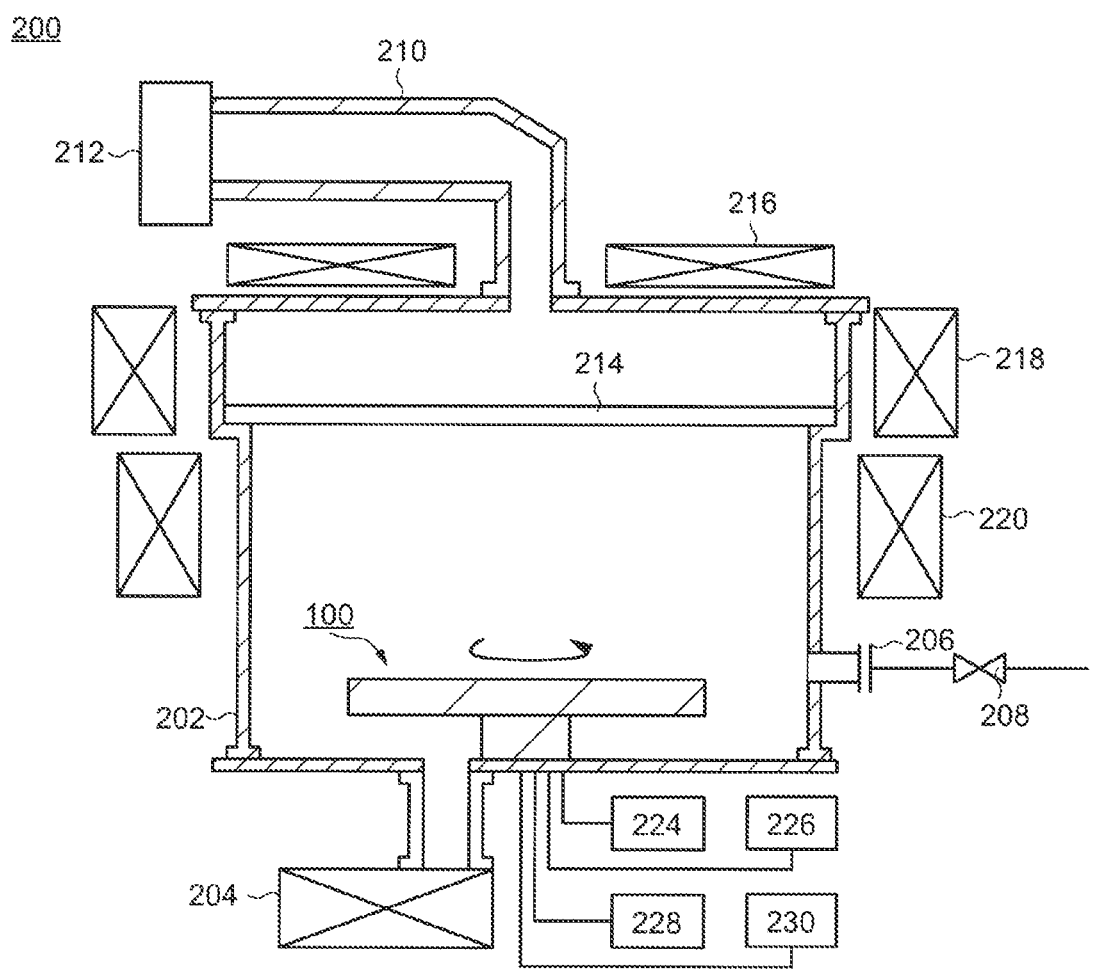
FIG. 17 is a schematic cross-sectional view of a film-processing apparatus including a stage according to an embodiment of the present invention.

In FIG. 17, a schematic cross-sectional view of an etching apparatus 200 for performing dry etching on a variety of films is illustrated as a film-forming apparatus. The etching apparatus 200 includes a chamber 202. The chamber 202 supplies a space to perform etching on a film of a conductor, an insulator, or a semiconductor formed on a substrate.

An exhaust device 204 is connected to the chamber 202, by which the inside of the chamber 202 can be set under a reduced-pressure atmosphere. The chamber 202 is further provided with an inlet tube 206 for introducing a reaction gas which is supplied to the chamber 202 through a valve 208. As the reaction gas, a fluorine-containing organic compound such as tetrafluorocarbon ($CF_4$), octafluorocyclobutane (c-$C_4F_8$), decafluorocyclopentane (c-$C_5F_{10}$), hexafluorobutadiene ($C_4F_6$) is represented, for example.

A microwave source 212 may be provided at an upper portion of the chamber 202 through a waveguide tube 210. The microwave source 212 has an antenna and the like for supplying a microwave and outputs a high-frequency microwave such as a microwave of 2.45 GHz and a radio wave (RF) of 13.56 MHz. The microwave generated by the microwave source 212 is transmitted to the upper portion of the chamber 202 with the waveguide tube 210 and then introduced into the chamber 202 through a window 214 including quartz, ceramic, or the like. The reaction gas is plasmatized with the microwave, and the etching proceeds with electrons, ions, and radicals included in the plasma.

The stage 100 according to an embodiment of the present invention is provided at a lower portion of the chamber 202 in order to place a substrate. The substrate 100 is placed over the stage 100. A power source 224 is connected to the stage 100, and high-frequency electric power is supplied to the stage 100, thereby forming an electric field in a direction perpendicular to the surfaces of the stage 100 and the substrate with the microwave. Magnets 216, 218, and 220 may be provided at the upper portion and on a side surface of the chamber 202. The magnets 216, 218, and 220 may each be a permanent magnet or an electromagnet having an electromagnetic coil. A magnetic component parallel to the surfaces of the stage 100 and the substrate is generated with the magnets 216, 218, and 220. The electrons in the plasma resonate upon receiving a Lorentz force in association with the electrical field generated by the microwave and are bound on the surfaces of the stage 100 and the substrate. Accordingly, high-density plasma can be generated on the substrate surface.

A heater power source 230 for controlling the sheath heater 110 provided to the stage 100 is connected to the stage 100. As an optional structure, a power source 226 for an electrostatic chuck for fixing the substrate to the stage, a temperature controller 228 for controlling the temperature of a medium circulated in the stage 100, a rotation-controlling device (not illustrated) for rotating the stage 100 may be further connected to the stage 100.

As described above, the stage 100 according to an embodiment of the present invention is employed in the etching apparatus 200. The use of this stage 100 allows a substrate to be uniformly heated and the heating temperature to be precisely controlled. Hence, the etching apparatus 200 enables precise patterning on a variety of films formed over a substrate.

2. CVD Apparatus

Figure 18:
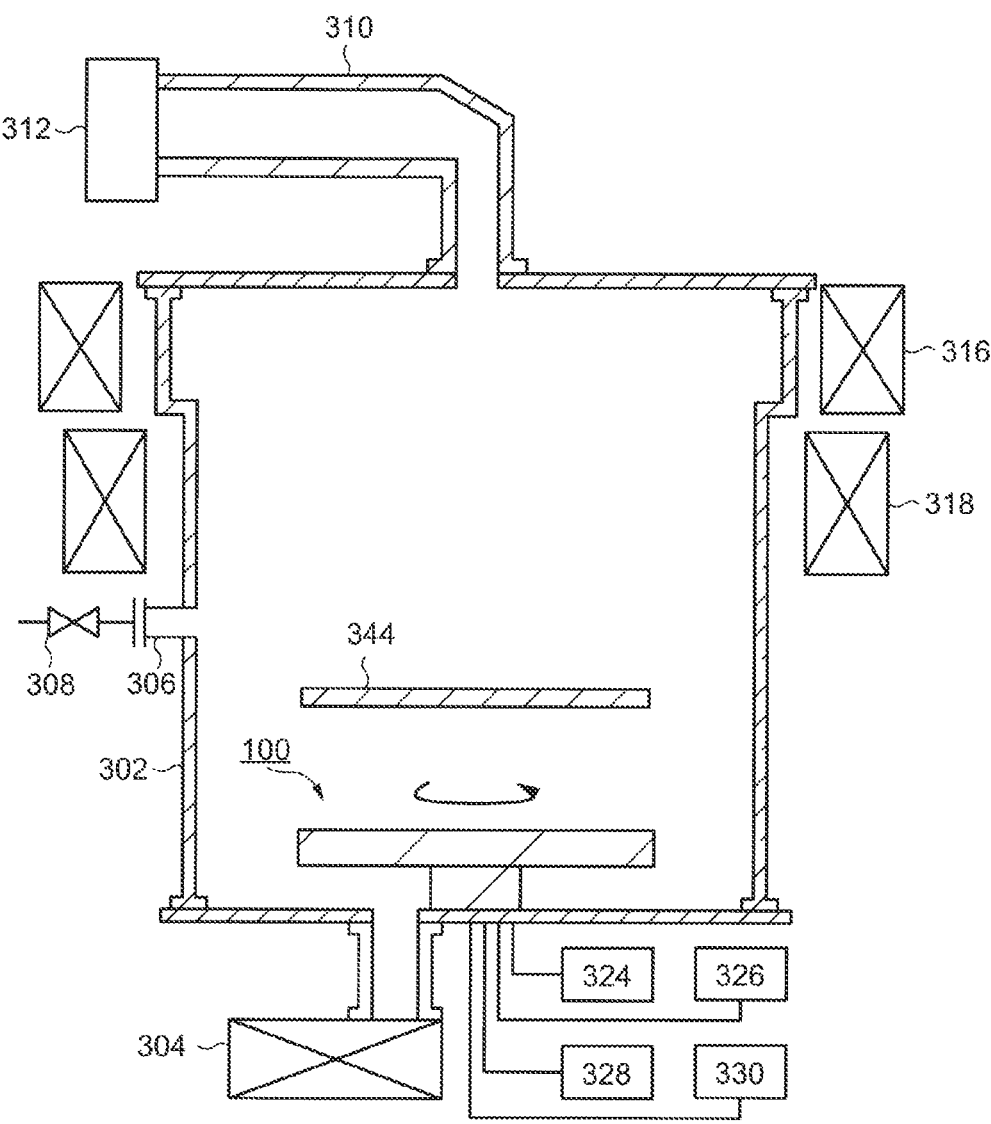
FIG. 18 is a schematic cross-sectional view of a film-forming apparatus including a stage according to an embodiment of the present invention.

FIG. 18 is a schematic view of a CVD apparatus 300 serving as a film-forming device. The CVD apparatus 300 has a chamber 302 providing a space for chemically reacting a reaction gas.

An exhaust apparatus 304 is connected to the chamber 302, by which the pressure in the chamber 302 can be reduced. The chamber 302 is further provided with an inlet tube 306 for introducing the reaction gas, and the reaction gas for film formation is introduced into the chamber 302 through a valve 308. As the reaction gas, a variety of gases can be used depending on the films to be formed. The gas may be a liquid at a normal temperature. For example, thin films of silicon, silicon oxide, silicon nitride, and the like can be prepared using silane, dichlorosilane, tetraethoxysilane, and the like. Alternatively, metal films of tungsten, aluminum, and the like can be prepared using tungsten fluoride, trimethylaluminum, and the like.

Similar to the etching apparatus 200, a microwave source 312 may be provided at an upper portion of the chamber 302 through a waveguide tube 310. A microwave generated with the microwave source 312 is introduced into the chamber 302 with the waveguide tube 310. The reaction gas is plasmatized with the microwave, and the chemical reaction of the gas is promoted by a variety of active species included in the plasma. Products obtained by the chemical reactions are deposited over a substrate, resulting in a thin film. As an optional element, a magnet 344 may be provided in the chamber 302 in order to increase plasma density. The stage 100 described in the First Embodiment is disposed at a lower portion of the chamber 302, which enables deposition of a thin film in a state where a substrate is placed over the stage 100. Similar to the etching apparatus 200, magnets 316 and 318 may be further provided on a side surface of the chamber 302.

A heater power source 330 for controlling the sheath heater 110 provided in the stage 100 is further connected to the stage 100. As an optional element, a power source 324 for supplying a high-frequency electric power to the stage 100, a power source 326 for an electrostatic chuck, a temperature controller 328 for temperature control of a medium circulated in the stage 100, or a rotation-controlling device (not illustrated) for rotating the stage 100, and the like may be connected to the stage 100.

3. Sputtering Apparatus

Figure 19:
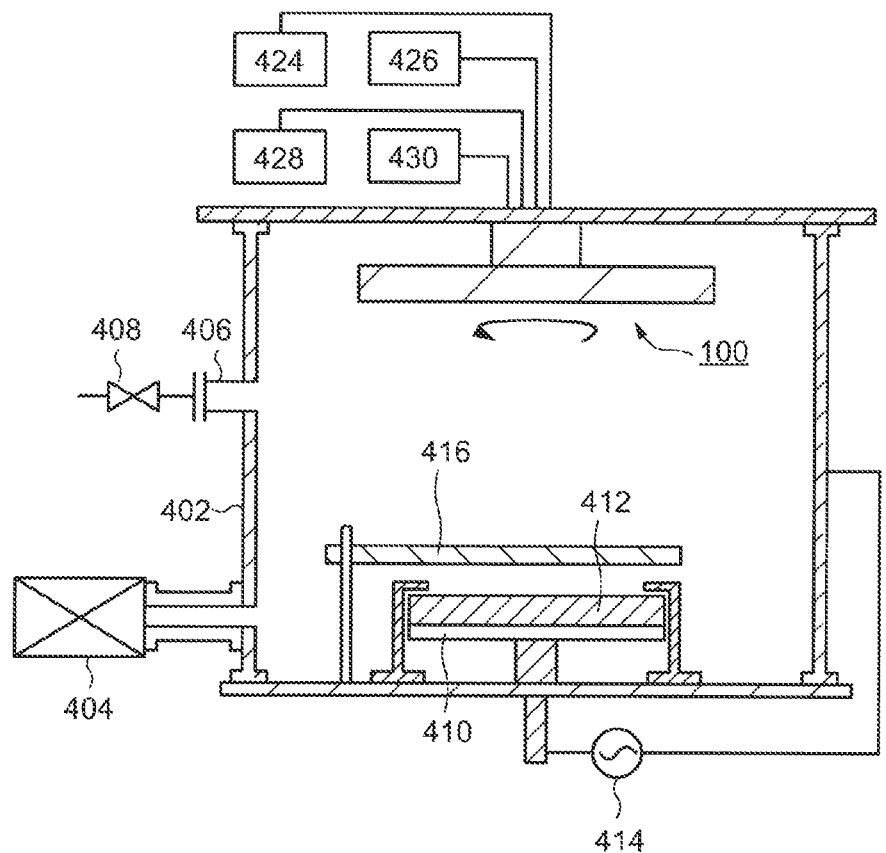
FIG. 19 is a schematic cross-sectional view of a film-forming apparatus including a stage according to an embodiment of the present invention.

FIG. 19 is a schematic view of a sputtering apparatus 400 serving as a film-forming apparatus. The sputtering apparatus 400 has a chamber 402 and provides a space for collision of high-speed ions with a target and deposition of target atoms generated by the collision.

An exhaust apparatus 404 for reducing a pressure in the chamber 402 is connected to the chamber 402. An inlet tube 406 for supplying a sputtering gas such as argon into the chamber 402 and a valve 408 are provided to the chamber 402.

A target stage 410 for supporting a target containing a material to be deposited and functioning as a cathode is arranged at a lower portion of the chamber 402, over which the target 412 is provided. A high-frequency power source 414 is connected to the target stage 410, and plasma can be generated in the chamber 402 with the high-frequency power source 414.

The stage 100 described in the First Embodiment may be disposed at an upper portion of the chamber 402. In this case, film-formation proceeds in the state where a substrate is placed under the stage 100. Similar to the etching apparatus 200 and the CVD apparatus 300, a heater-power source 430 is connected to the stage 100. A power source 424 for supplying a high-frequency electric power to the stage 100, a power source 426 for an electrostatic chuck, a temperature controller 428, and a rotation-controlling device (not illustrated) for rotating the stage 100 may be connected to the stage 100.

Argon ions accelerated with the plasma generated in the chamber 402 collide with the target 412, and the atoms of the target 412 are sputtered. The sputtered atoms fly to a substrate placed under the stage 100 while a shutter 416 is opened and are deposited.

In the present embodiment, a structure is exemplified in which the stage 100 and the target stage 410 are respectively disposed at the upper portion and the lower portion of the chamber 402. However, the present embodiment is not limited to this structure, and the sputtering apparatus 400 may be configured so that the target 412 is positioned over the stage 100. Alternatively, the stage 100 may be disposed so that a main surface of the substrate is arranged perpendicularly to the horizontal plane, and the target stage 410 may be arranged to oppose the stage 100.

4. Evaporation Apparatus

Figure 20:
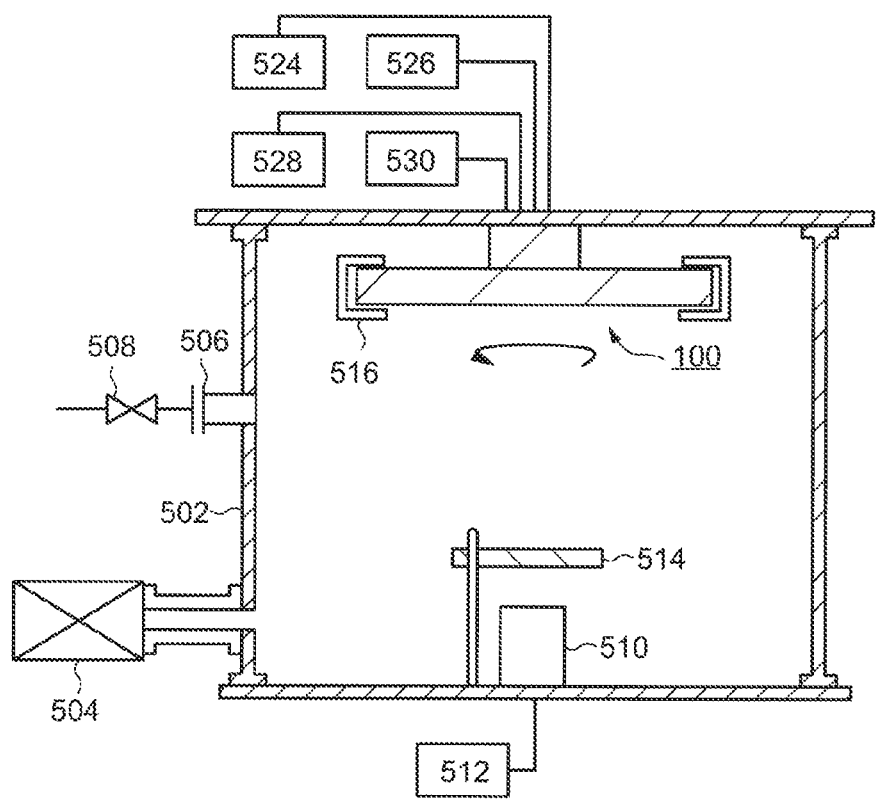
FIG. 20 is a schematic cross-sectional view of a film-forming apparatus including a stage according to an embodiment of the present invention.

FIG. 20 is a schematic view of an evaporation apparatus 500 serving as a film-forming apparatus. The evaporation apparatus 500 has a chamber 502, and a space for evaporating a material in an evaporation source 510 and depositing the evaporated material over a substrate.

An exhaust apparatus 504 for making the inside of the chamber 502 a high vacuum is connected to the chamber 502. An inlet tube 506 for returning the inside of the chamber 502 to an atmospheric pressure is provided to the chamber 502, and an inert gas such as nitrogen and argon is introduced into the chamber 502 through a valve 508.

The stage 100 may be disposed at an upper portion of the chamber 502. Deposition of the material proceeds in a state where a substrate is placed under the stage 100. Similar to the etching apparatus 200, the CVD apparatus 300, and the sputtering apparatus 400, a heater-power source 528 is connected to the stage 100. As an optional structure, a power source 524 for an electrostatic chuck, a temperature controller 526, and a rotation-controlling device 530 for rotating the stage 100 may be connected to the stage 100. The stage 100 may further include a mask holder 516 for fixing a metal mask between the substrate and the evaporation source 510. With this structure, it is possible to arrange the metal mask at a vicinity of the substrate so that an opening portion of the metal mask overlaps with a region where the material is to be deposited.

The evaporation source 510 is provided at a lower portion of the chamber 502 into which the material subjected to evaporation is charged. A heater for heating the material is provided to the evaporation source 510, and the heater is controlled with a controlling apparatus 512. The inside of the chamber 502 is made a high vacuum using the exhaust apparatus 504, and the material is vaporized by heating the evaporation source 510 to start evaporation. A shutter 514 is opened when an evaporation rate becomes constant, by which deposition of the material is started over the substrate.

As described above, the stage according to an embodiment of the present invention is used for the film-forming apparatus such as the CVD apparatus 300, the sputtering apparatus 400, and the evaporation apparatus 500 of the present embodiment. It is possible to uniformly heat a substrate and precisely control the heating temperature using the stage. Accordingly, the use of these film-forming apparatuses enables uniform formation of a variety of films with controlled properties over a substrate.

Sixth Embodiment

In the present embodiment, a stage 148 having a structure different from those of the stages 100, 140, and 142 respectively described in the First, Second, and Third Embodiments is explained. An explanation of the structures the same as or similar to those described in the First to Fourth Embodiments may be omitted. Although the stage 148 in which a plurality of mono-terminal type sheath heaters is used is explained in the present embodiment, a single sheath heater may be used or a single or a plurality of bi-terminal type sheath heaters may be applied.

Figure 21A:
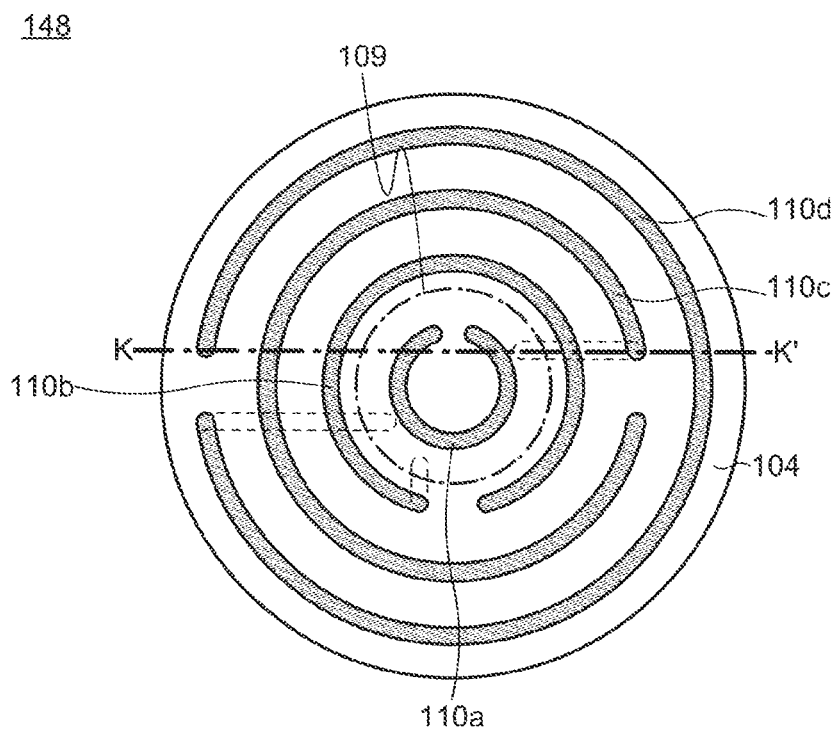
FIG. 21A and FIG. 21B are respectively schematic top and cross-sectional views of a stage according to an embodiment of the present invention.
Figure 21B:
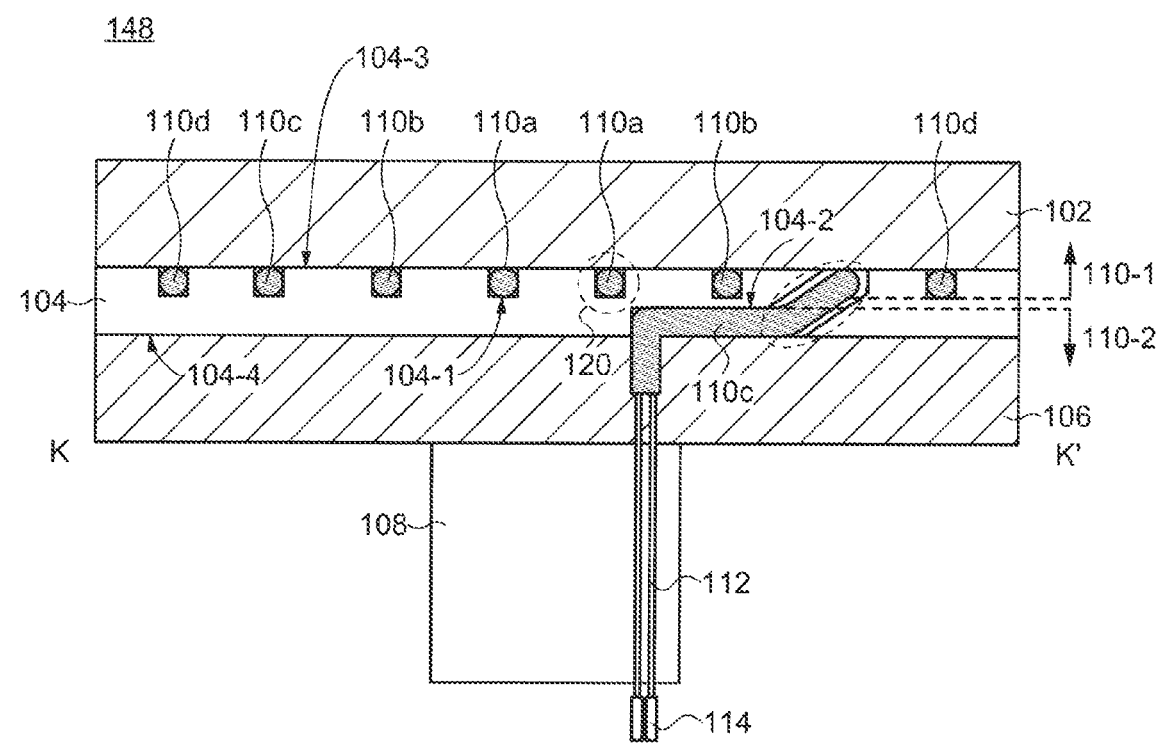

A schematic top view of the stage 148 is shown in FIG. 21A, while a schematic view of a cross section along a chain line K-K' in FIG. 21A is shown in FIG. 21B. Similar to the other stages 100, 140, and 142, the sheath heater 110 passes through the second supporting plate 104, and at least one sheath heater 110 is arranged so as to provide the upper section 110-1 and the lower section 110-2. However, in the stage 148, at least one sheath heater 110 extends diagonally with respect to the first plane 104-1 and the second plane 104-2 between the upper section 110-1 and the lower section 110-2. For example, a portion of the third sheath heater 110c between the upper section 110-1 and the lower section 110-2 is arranged diagonally with respect to the first plane 104-1 and the second plane 104-2 and as shown in FIG. 21B (see a region surrounded by an ellipse formed by a chain line). Thus, a portion between a terminal of the first trench 120 and a terminal of the second trench 122 is also arranged diagonally with respect to the first plane 104-1 and the second plane 104-2. The diagonally arranged portion of the sheath heater 110 is preferred to be arranged so that a direction from the upper section 110-1 to the lower section 110-2 faces a direction from the periphery to the center of the stage 148. With respect to the other sheath heaters 110, the portion between the upper section 110-1 and the lower section 110-2 may be diagonally arranged.

Since the application of this arrangement enables reduction of the folding angle of the sheath heater 110, not only the stress applied to the folded portion can be decreased but also the degree of freedom for arranging the sheath heater 110 can be improved. In addition, the sheath heater 110 having a large external diameter can be employed, and the thickness of the second supporting plate 104 can also be reduced.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is understood that another effect different from that provided by each of the aforementioned embodiments is achieved by the present invention if the effect is obvious from the description in the specification or readily conceived by persons ordinarily skilled in the art.

What is claimed is:

1. A stage comprising:
    a first supporting plate;
    a second supporting plate located under the first supporting plate and having a first through hole and a second through hole;
    a shaft located under the second supporting plate and overlapping with the first supporting plate and the second supporting plate; and
    at least one sheath heater comprising a heater wire, an insulator surrounding the heater wire, a metal sheath surrounding the insulator and configured to receive thermal energy from the heater wire, and a lead wiring electrically connected to the heater wire,
    wherein the metal sheath passes through the first through hole and the second through hole of the second supporting plate and includes an upper portion and a lower portion respectively extending on a first plane and a second plane which are parallel to an upper surface of the second supporting plate and which are different in distance from the first supporting plate,
    wherein the metal sheath has two bent portions respectively bent at the first through hole and the second through hole,
    the upper portion extends from the first through hole to the second through hole,
    the metal sheath contains stainless steel,
    the first supporting plate and the second supporting plate each contain aluminum, and
    wherein the upper portion is exposed from the upper surface of the second supporting plate, and
    the lower portion extending on the second plane is exposed from a lower surface of the second supporting plate.

2. The stage according to claim 1, further comprising a third supporting plate located under the second supporting plate and overlapping with the lower portion.

3. The stage according to claim 1,
    wherein the upper portion orthogonally overlaps the lower portion with the second supporting plate sandwiched therebetween.

4. The stage according to claim 2,
    wherein the second supporting plate has a first trench on the upper surface, and
    the upper portion extends in the first trench.

5. The stage according to claim 2,
    wherein the second supporting plate has a second trench on a lower surface, and
    the lower portion extends in the second trench.

6. The stage according to claim 1,
wherein the first supporting plate has a third trench on a lower surface, and
the upper portion extends in the third trench.

7. The stage according to claim 2,
wherein the third supporting plate has a fourth trench on an upper surface, and
the lower portion extends in the fourth trench.

8. The stage according to claim 1,
wherein the at least one sheath heater includes a plurality of sheath heaters.

9. The stage according to claim 8,
wherein the plurality of sheath heaters includes a first sheath heater and a second sheath heater, and
the lower portion of the second sheath heater overlaps the upper portion of the first sheath heater extending on the first plane with the second supporting plate sandwiched therebetween.

10. The stage according to claim 1,
wherein the lead wiring extends on the second plane to a region where the second supporting plate overlaps with the shaft.

11. The stage according to claim 1,
wherein the heater wire has a helical structure.

12. The stage according to claim 1,
wherein the heater wire has a ribbon shape.

13. The stage according to claim 1,
wherein the heater wire is folded in the metal sheath and has a double-helical structure.

14. The stage according to claim 1,
wherein an external diameter of the metal sheath is equal to or more than 3.0 mm and equal to or less than 11.0 mm.

15. The stage according to claim 1,
wherein the metal sheath extends diagonally with respect to the first plane between the upper portion and the lower portion.

16. A film-forming apparatus comprising the stage according to claim 1.

17. A film-processing apparatus comprising the stage according to claim 1.

18. The stage according to claim 1, wherein a cross section of the metal sheath perpendicular to an extending direction thereof is circular.

* * * * *